United States Patent
Yamazaki et al.

(10) Patent No.: US 7,884,369 B2
(45) Date of Patent: Feb. 8, 2011

(54) WIRING AND METHOD OF MANUFACTURING THE SAME, AND WIRING BOARD AND METHOD OF MANUFACTURING THE SAME

(75) Inventors: Shunpei Yamazaki, Setagaya (JP); Hideomi Suzawa, Atsugi (JP); Koji Ono, Atsugi (JP); Yoshihiro Kusuyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 52 days.

(21) Appl. No.: 11/525,016

(22) Filed: Sep. 22, 2006

(65) Prior Publication Data

US 2007/0013859 A1    Jan. 18, 2007

Related U.S. Application Data

(62) Division of application No. 10/099,972, filed on Mar. 19, 2002, now Pat. No. 7,169,710.

(30) Foreign Application Priority Data

Mar. 27, 2001   (JP) .............................. 2001-091192

(51) Int. Cl.
   H01L 27/14    (2006.01)
   H01L 29/04    (2006.01)
   H01L 29/15    (2006.01)
   H01L 31/036   (2006.01)

(52) U.S. Cl. ................................. 257/72; 257/E27.108

(58) Field of Classification Search .................. 257/72, 257/E27.108

See application file for complete search history.

(56) References Cited

U.S. PATENT DOCUMENTS 5,132,745 A * 7/1992 Kwasnick et al. ........... 257/412

(Continued)

FOREIGN PATENT DOCUMENTS

CN    1258103    6/2000

(Continued)

OTHER PUBLICATIONS

Silicon Processing for VLSI Era, vol. 1, S.Wolf and R.N. Tauber, 1986, p. 518.*

(Continued)

*Primary Examiner*—Bradley K Smith
*Assistant Examiner*—Alexander Belousov
(74) *Attorney, Agent, or Firm*—Eric J. Robinson; Robinson Intellectual Property Law Office, P.C.

(57) ABSTRACT

The wiring of the present invention has a layered structure that includes a first conductive layer (first layer) having a first width and made of one or a plurality of kinds of elements selected from W and Mo, or an alloy or compound mainly containing the element, a low-resistant second conductive layer (second layer) having a second width smaller than the first width, and made of an alloy or a compound mainly containing Al, and a third conductive layer (third layer) having a third width smaller than the second width, and made of an alloy or compound mainly containing Ti. With this constitution, the present invention is fully ready for enlargement of a pixel portion. At least edges of the second conductive layer have a taper-shaped cross-section. Because of this shape, satisfactory coverage can be obtained.

55 Claims, 22 Drawing Sheets

U.S. PATENT DOCUMENTS

| | | | |
|---|---|---|---|
| 5,153,754 A * | 10/1992 | Whetten | 349/147 |
| 5,187,602 A * | 2/1993 | Ikeda et al. | 349/39 |
| 5,428,250 A * | 6/1995 | Ikeda et al. | 349/147 |
| 5,464,500 A * | 11/1995 | Tsujimura et al. | 216/34 |
| 5,498,573 A * | 3/1996 | Whetten | 438/644 |
| 5,528,082 A * | 6/1996 | Ho et al. | 257/775 |
| 5,539,551 A | 7/1996 | Nomoto et al. | |
| 5,670,062 A | 9/1997 | Lin et al. | |
| 5,747,361 A | 5/1998 | Ouellet | |
| 5,852,481 A * | 12/1998 | Hwang | 349/43 |
| 5,858,879 A * | 1/1999 | Chao et al. | 438/725 |
| 5,912,506 A * | 6/1999 | Colgan et al. | 257/750 |
| 5,994,156 A * | 11/1999 | Voutsas et al. | 438/30 |
| 6,031,290 A | 2/2000 | Miyazaki et al. | |
| 6,144,082 A * | 11/2000 | Yamazaki et al. | 257/412 |
| 6,166,396 A | 12/2000 | Yamazaki | |
| 6,259,138 B1 | 7/2001 | Ohtani et al. | |
| 6,335,290 B1 | 1/2002 | Ishida | |
| 6,365,917 B1 | 4/2002 | Yamazaki | |
| 6,433,842 B1 | 8/2002 | Kaneko et al. | |
| 6,436,850 B1 | 8/2002 | Morales | |
| 6,440,865 B1 | 8/2002 | Lee | |
| 6,448,578 B1 | 9/2002 | Shimada et al. | |
| 6,475,836 B1 | 11/2002 | Suzawa et al. | |
| 6,501,098 B2 | 12/2002 | Yamazaki | |
| 6,515,336 B1 | 2/2003 | Suzawa et al. | |
| 6,534,789 B2 | 3/2003 | Ishida | |
| 6,657,260 B2 | 12/2003 | Yamazaki et al. | |
| 6,825,488 B2 | 11/2004 | Yamazaki et al. | |
| 6,900,460 B2 | 5/2005 | Yamazaki et al. | |
| 6,909,114 B1 | 6/2005 | Yamazaki | |
| 6,949,767 B2 | 9/2005 | Yamazaki | |
| 6,953,951 B2 | 10/2005 | Yamazaki et al. | |
| 6,984,550 B2 | 1/2006 | Yamazaki et al. | |
| 7,023,021 B2 | 4/2006 | Yamazaki et al. | |
| 7,084,019 B2 | 8/2006 | Yamazaki et al. | |
| 2001/0025960 A1 | 10/2001 | Ohtani et al. | |
| 2001/0030322 A1 | 10/2001 | Yamazaki et al. | |
| 2001/0049197 A1 | 12/2001 | Yamazaki et al. | |
| 2001/0052950 A1 | 12/2001 | Yamazaki et al. | |
| 2001/0055841 A1 | 12/2001 | Yamazaki et al. | |
| 2002/0006705 A1 | 1/2002 | Suzawa et al. | |
| 2002/0013022 A1 | 1/2002 | Yamazaki et al. | |
| 2002/0016028 A1 | 2/2002 | Arao et al. | |
| 2002/0017685 A1 | 2/2002 | Kasahara et al. | |
| 2002/0070382 A1 | 6/2002 | Yamazaki et al. | |
| 2002/0110941 A1 | 8/2002 | Yamazaki et al. | |
| 2002/0158288 A1 | 10/2002 | Yamazaki et al. | |
| 2003/0094614 A1 | 5/2003 | Yamazaki et al. | |
| 2003/0122132 A1 | 7/2003 | Yamazaki | |
| 2005/0056934 A1 | 3/2005 | Suzawa et al. | |
| 2005/0104068 A1 | 5/2005 | Yamazaki | |
| 2005/0110016 A1 | 5/2005 | Yamazaki | |
| 2005/0266593 A1 | 12/2005 | Suzawa et al. | |
| 2006/0091387 A1 | 5/2006 | Yamazaki | |
| 2006/0273317 A1 | 12/2006 | Yamazaki et al. | |

FOREIGN PATENT DOCUMENTS

| | | |
|---|---|---|
| CN | 1282107 | 1/2001 |
| EP | 0 082 012 | 6/1983 |
| EP | 1 003 223 | 5/2000 |
| EP | 1 005 093 | 5/2000 |
| EP | 1 005 094 | 5/2000 |
| EP | 1 041 641 | 10/2000 |
| EP | 1 045 451 | 10/2000 |
| EP | 1 071 124 | 1/2001 |
| EP | 1071124 A2 * | 1/2001 |
| JP | 06-148685 | 5/1994 |
| JP | 07-235680 | 9/1995 |
| JP | 08-274336 | 10/1996 |
| JP | 09-045688 | 2/1997 |
| JP | 11-016913 | 1/1999 |
| JP | 2000-047263 A | 2/2000 |
| JP | 2000-223714 | 8/2000 |
| JP | 2001-053283 | 2/2001 |
| JP | 2001-085700 | 3/2001 |
| JP | 2001-144297 | 5/2001 |
| KR | 165416 | 2/1999 |
| KR | 1999-0061336 A | 7/1999 |
| KR | 2000-015639 | 3/2000 |
| KR | 2000-063024 | 10/2000 |

OTHER PUBLICATIONS

Search Report and Written Opinion, Application No. 200201417-3, Intellectual Property Office of Singapore, May 7, 2004.
Search Report, Australian Patent Office, Application No. SG200200805-0, Feb. 16, 2004.
Wolf et al., Silicon Processing for the VLSI Era, 1986, vol. 1—Process Technology, p. 518.
Office Action (Application No. 2007-0029975) dated Jan. 28, 2008.
Office Action (Application No. 2007-0029977) dated Jan. 28, 2008.
Office Action (Application No. 2007-0029977; KR 5628 D2) dated Aug. 21, 2008 with English translation.
Office Action (Application No. 2007-10085019.0) dated Jan. 16, 2009 with English translation.
Office Action (Application No. 2009-0022565) Dated May 18, 2009.

* cited by examiner

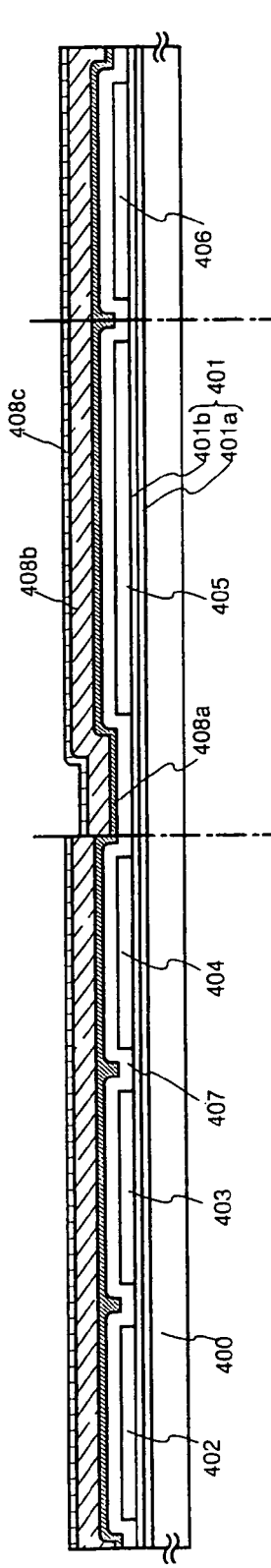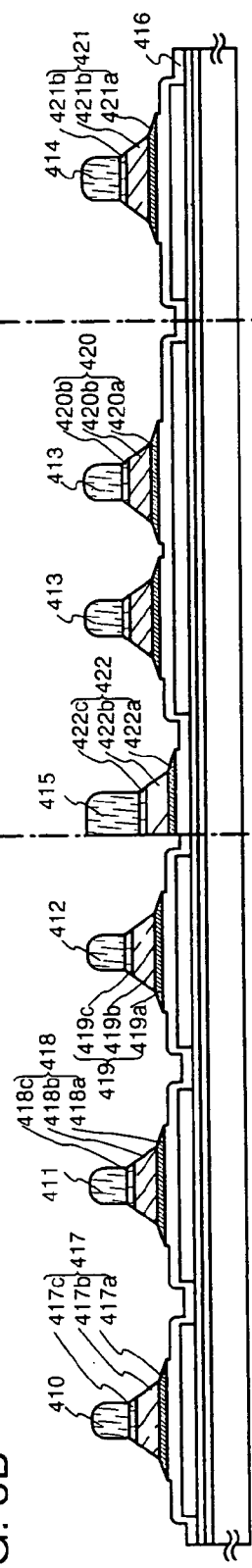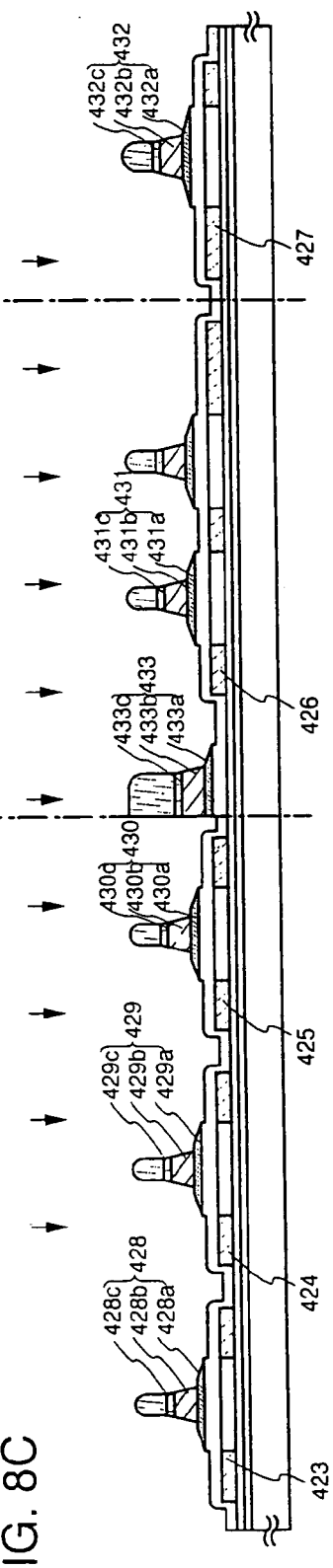

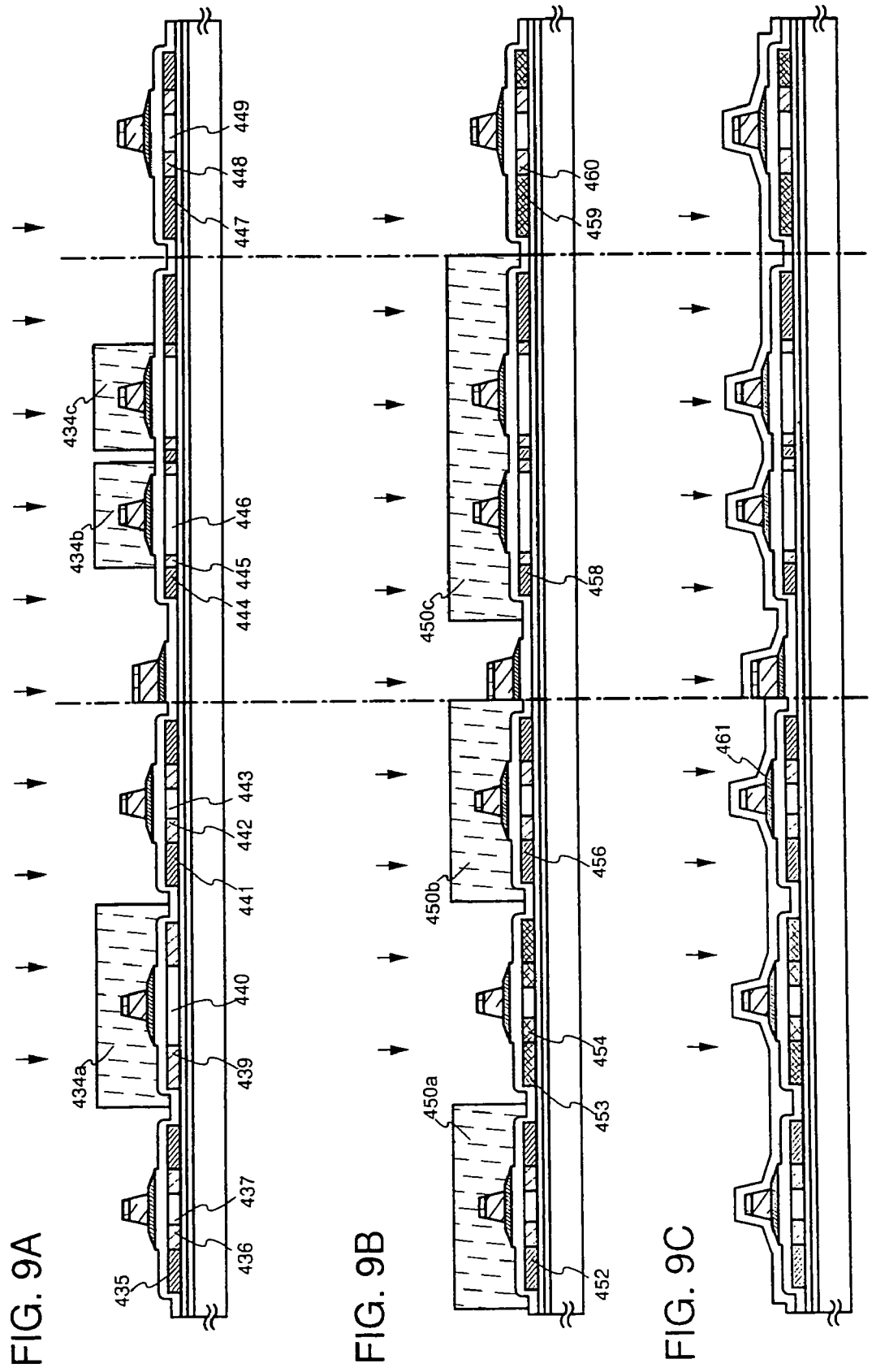

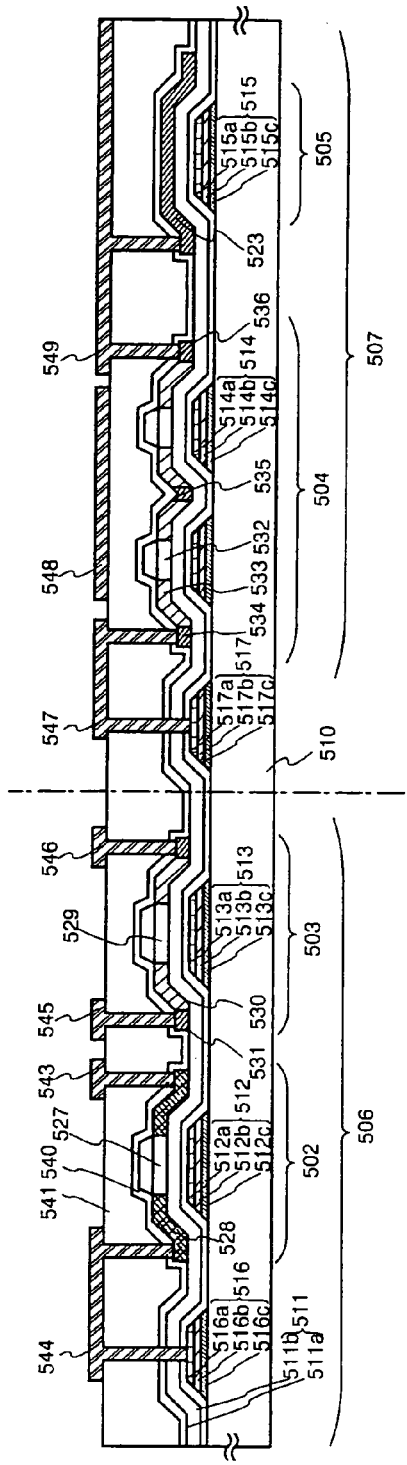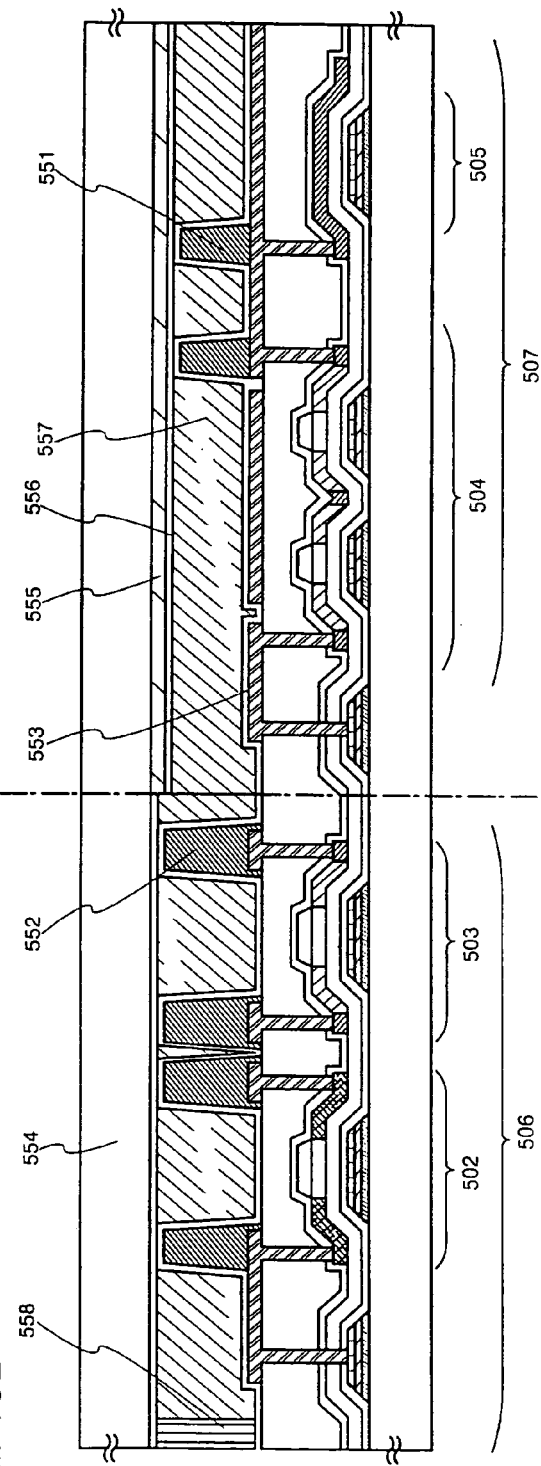
FIG. 18A
FIG. 18B

WIRING AND METHOD OF MANUFACTURING THE SAME, AND WIRING BOARD AND METHOD OF MANUFACTURING THE SAME

BACKGROUND OF THE INVENTION

1. Field of the Invention

The present invention relates to wiring formed by using a thin film technique and a method of manufacturing the same. The present invention also relates to a wiring board and a method of manufacturing the same. In the present specification, a wiring board refers to an insulating substrate made of glass, etc. or various substrates having wiring formed by using a thin film technique.

2. Description of the Related Art

In recent years, a technique of forming a thin film transistor (TFT) using a semiconductor thin film (thickness of about several to hundreds of nm) formed on a substrate with an insulating surface has been paid attention to. A TFT is widely applied to an electronic device such as an integrated circuit (IC) and an electrooptic apparatus. In particular, a TFT is being rapidly developed as a switching element of an image display apparatus.

Conventionally, a liquid crystal display device as an image display apparatus is known. Since an image of higher precision can be obtained compared with a passive type liquid crystal display device, an active matrix type liquid crystal display device is being used more. In an active matrix type liquid crystal display device, pixel electrodes arranged in matrix are driven, whereby a display pattern is formed on a screen. More specifically, a voltage is applied between a selected pixel electrode and a counter electrode corresponding to the pixel electrode whereby a liquid crystal layer disposed between the pixel electrode and the counter electrode is subjected to optical modulation, and this optical modulation is recognized by an observer as a display pattern.

Such an active matrix type liquid crystal display device finds a wider range of uses, and there is an increasing demand for high precision, a high aperture ratio, and high reliability, as well as enlargement of a screen size. There is also a demand for enhancement of productivity and a decrease in cost.

In the case where aluminum (Al) is used as wiring of the above-mentioned TFT in order to manufacture TFT, projections such as hillock and whisker are formed due to a heat treatment, and an Al atom diffuses to an insulating film and an active region (in particular, a channel-formation region), which may cause operation defects of the TFT or a decrease in electrical characteristics of the TFT.

Under such a circumstance, the use of a metal material withstanding a heat treatment (typically, a metal element having a high melting point, such as tungsten (W) and molybdenum (Mo)) is considered. However, the resistance of these elements is very high compared with that of Al (see Table 1).

TABLE 1

| wiring material | resistivity [μΩcm] |
|---|---|
| Al | 2 |
| W | 10~20 |
| Mo | 15~25 |

Therefore, when a screen size is enlarged, a wiring delay becomes a problem. In view of this, a method for decreasing a resistance by making wiring thicker is considered. However, when the width of wiring is enlarged, a degree of design freedom and an aperture ratio in a pixel portion may be lowered. Furthermore, when the film thickness of wiring is made larger, a short-circuit is likely to be caused at a portion where wiring crosses to each other three-dimensionally, and coverage is degraded at the step difference portion of the wiring.

SUMMARY OF THE INVENTION

Therefore, with the foregoing in mind, it is an object of the present invention to provide wiring that is ready for enlargement of a screen and a method of manufacturing the same, and a wiring board and a method of manufacturing the same.

According to the present invention, wiring has a layered structure that includes: as a first layer, a conductive film mainly containing one or a plurality of kinds of elements selected from W and Mo, or one or a plurality of kinds of elements selected from W and Mo; as a second layer, a low-resistant conductive film mainly containing Al; and as a third layer, a conductive film mainly containing Ti, whereby it is attempted to lower a resistance of wiring. According to the present invention, the low-resistant conductive film mainly containing Al is sandwiched with other conductive films, whereby formation of projections such as hillock and whisker due to a heat treatment can be prevented. Furthermore since the first and third layers are made of conductive films with a high melting point, they function as barrier metal, which can prevent an Al atom from diffusing to an insulating film and an active region (Table 2). Furthermore, when an insulating film is formed on wiring of the present invention, and contact with the wiring is formed, the third layer functions as a stopper for etching of the insulating film so that contact can be easily formed. When Al comes into contact with an ITO film (typical transparent conductive film), Al causes electric corrosion to increase a contact resistance. However, the third layer is made of a conductive film mainly containing Ti, so that a contact resistance becomes satisfactory.

TABLE 2

| wiring material | melting point [° C.] |
|---|---|
| Al | 660.4 |
| W | 3387 |
| Mo | 2610 |
| Ti | 1675 |

Furthermore, according to the present invention, at least edges of the second layer made of a low-resistant conductive film mainly containing Al have a taper shape. Because of the taper shape, coverage at the step difference portion is enhanced. In the present specification, a taper angle refers to an angle formed by a horizontal surface and a side surface of a material layer. Furthermore, in the present specification, for convenience sake, the side surface with a taper angle is referred to as a taper shape, and a portion with a taper shape is referred to as a taper portion.

A constitution of the present invention disclosed in the present specification relates to wiring having a layered structure that includes a first conductive layer with a first width as a first layer, a second conductive layer with a second width smaller than the first width as a second layer, and a third conductive layer with a third width smaller than the second width as a third layer, characterized in that a cross-section of edges of the first conductive layer, the second conductive layer, or the third conductive layer has a taper shape.

In the above-mentioned constitution, the wiring is characterized by having a layered structure that includes a conductive layer (first layer) made of an alloy or a compound mainly containing W, a conductive layer (second layer) made of an alloy or a compound mainly containing Al, and a conductive layer (third layer) made of an alloy or a compound mainly containing Ti. Alternatively, the wiring is characterized by having a layered structure that includes a conductive layer (first layer) made of an alloy or a compound mainly containing Mo, a conductive layer (second layer) made of an alloy or a compound mainly containing Al, and a conductive layer (third layer) made of an alloy or a compound mainly containing Ti. For example, as the first layer, W, WN, Mo, or the like can be used. As the second layer, Al, Al—Si (2 wt %), Al—Ti (1 wt %), Al—Nd (1 wt %), Al—Sc (0.18 wt %), or the like can be used. As the third layer, Ti, TiN, or the like can be used. These layers can be formed by sputtering, plasma CVD, or the like. Furthermore, when Al—Si or the like is formed in the second layer, there is a limit (solid solubility limit) to the ratio at which an element such as Si can dissolve in Al. As the solution degree is higher, a resistance is increased, and heat resistance is also changed. Therefore, those skilled in the art may appropriately determine the ratio of Si or the like to Al, depending upon the resistance and heat resistance suitable for wiring, and the solid solubility limit of an element such as Si.

Table 3 shows examples of a resistance in each conductive layer that constitutes wiring. It is understood from Table 3 that a conductive layer made of an alloy or a compound mainly containing Al has a very low resistance, compared with the other conductive layers.

TABLE 3

| wiring material | | resistivity [μΩcm] |
|---|---|---|
| material mainly containing W | W | 10~20 |
| | WN | 150~220 |
| material mainly containing Al | Al | 2 |
| | Al—Si (2 wt %) | 3.5~4.5 |
| | Ai—Ti (1 wt %) | 8~10 |
| | Al—Nd (1 wt %) | 7~10 |
| | Al—Sc (0.18 wt %) | 3.5~4.0 |
| material mainly containing Ti | Ti | 50~60 |
| | TiN | 130~200 |

Any etching method can be applied, as long as the first, second, and third conductive films having heat resistance and conductivity can be etched at a high speed with good precision, and end portions of the films can be tapered. Among them, a dry etching method using high-density plasma is desirably used. An etching apparatus using a microwave, helicon wave plasma (HWP), or inductively coupled plasma (ICP) is suitable for a procedure of obtaining high-density plasma. For example, an electron cyclotron resonance (ECR) etching apparatus, a surface wave plasma (SWP) etching apparatus, an ICP etching apparatus, a two-frequency parallel-plate excitation-type etching apparatus, or the like may be used. In particular, the ICP etching apparatus controls plasma easily, and is ready for enlargement of a substrate to be treated.

For example, in order to conduct a plasma treatment with high precision, a method of forming plasma by applying a high-frequency electric power to a multi-spiral coil (in which a plurality of spiral coil portions are connected in parallel via an impedance matching circuit) is used. Furthermore a high-frequency electric power is also applied to a lower electrode holding a substance to be treated, thereby supplying a bias voltage thereto.

When the ICP etching apparatus adopting such a multi-spiral coil is used, a taper angle is substantially varied depending upon a bias electric power applied to a substrate side. Therefore, by further increasing a bias electric power and changing a pressure, a taper angle can be changed in a range of 5° to 85°.

As gas used for etching the second and third layers, a chlorine gas is desirable. For example, $SiCl_4$, HCl, $CCl_4$, $BCl_3$, $Cl_2$, or the like can be used.

As gas used for etching the first layer, fluorine gas is desirable. For example, $NF_3$, $CF_4$, $C_2F_6$, $SF_6$, or the like can be used. When a chlorine gas is introduced simultaneously with a fluorine gas, an etching rate in the first layer is enhanced, which is desirable.

Furthermore, by allowing the wiring to have a layered structure including the above-mentioned conductive layers, the edges of the wiring are tapered by using an ICP etching method or the like. By tapering the edges of the wiring, coverage of films to be formed in the later processes can be made satisfactory.

In the above-mentioned constitution, the edges of the first conductive layer are desirably tapered. A portion having a taper shape (i.e. a taper portion) is a region that is not overlapped with the second conductive layer, and the width of the region corresponds to that obtained by subtracting the second width from the first width. It is also desirable that the second conductive layer is tapered, and the taper angle thereof is made larger than that of the taper portion of the first conductive layer. Furthermore, it is desirable that the third conductive layer is tapered and the taper angle thereof is made substantially the same as that of the taper portion of the second conductive layer.

The constitution for realizing the present invention relates to a method of a manufacturing wiring comprising the steps of: forming a first-shaped conductive layer comprising a lamination of a first conductive layer, a second conductive layer, and a third conductive layer on an insulating surface: etching the first conductive layer the second conductive layer and the third conductive layer to form a second-shaped conductive layer comprising a lamination of the first conductive layer with a first width, a second conductive layer with a second width, and a third conductive layer with a third width; and etching the second conductive layer with the second width and the third conductive layer with the third width to form a third-shaped conductive layer comprising a lamination of a first conductive layer with a fourth width, a second conductive layer with a fifth width, and a third conductive layer with sixth width, wherein a cross-section of edges of the first conductive layer, the second conductive layer, or the third conductive layer has a taper shape.

In the above-mentioned constitution, the wiring is characterized by having a layered structure including a conductive layer (first layer) made of an alloy or a compound mainly containing W, a conductive layer (second layer) made of an alloy or a compound mainly containing Al, and a conductive layer (third layer) made of an alloy or a compound mainly containing Ti. Alternatively, the wiring is characterized by having a layered structure including a conductive layer (first layer) made of an alloy or a compound mainly containing Mo, a conductive layer (second layer) made of an alloy or a compound mainly containing Al, and a conductive layer (third layer) made of an alloy or a compound mainly containing Ti.

Furthermore, by allowing the wiring to have a layered structure including the above-mentioned conductive layers, the edges of the wiring are tapered by using an ICP etching method or the like. By tapering the edges of the wiring, coverage of films to be formed in the later processes can be made satisfactory.

In the above-mentioned constitution, the edges of the first conductive layer are desirably tapered. A portion having a taper shape (i.e., a taper portion) is a region that is not overlapped with the second conductive layer, and the width of the region corresponds to that obtained by subtracting the second width from the first width. It is also desirable that the second conductive layer is tapered, and the taper angle thereof is made larger than that of the taper portion of the first conductive layer. Furthermore, it is desirable that the third conductive layer is tapered and the taper angle thereof is made substantially the same as that of the taper portion of the second conductive layer.

The constitution of the present invention relates to a wiring board including an insulating substrate and wiring, characterized in that the wiring has a layered structure including: as a first layer, a first conductive layer with a first width; as a second layer, a second conductive layer with a second width smaller than the first width; and as a third layer, a third conductive layer with a third width smaller than the second width, and characterized in that a cross-section of edges of the first conductive layer, the second conductive layer, or the third conductive layer has a taper shape.

In the above-mentioned constitution, the process of forming the wiring is characterized in that a conductive film mainly containing W, a conductive film mainly containing Al, and a conductive film mainly containing Ti are stacked on top of each other, followed by etching with a mask. Furthermore, in the above-mentioned constitution, the process of forming the wiring is characterized in that a conductive film mainly containing Mo, a conductive film mainly containing Al, and a conductive film mainly containing Ti are stacked on top of each other, followed by etching with a mask.

In the above-mentioned constitution, the edges of the first conductive layer are desirably tapered. A portion having a taper shape (i.e., a taper portion) is a region that is not overlapped with the second conductive layer, and the width of the region corresponds to that obtained by subtracting the second width from the first width. It is also desirable that the second conductive layer is tapered, and the taper angle thereof is made larger than that of the taper portion of the first conductive layer. Furthermore, it is desirable that the third conductive layer is tapered, and the taper angle thereof is made substantially the same as that of the taper portion of the second conductive layer.

Furthermore, the constitution for realizing the present invention relates to a method of manufacturing a wiring board, characterized by including the steps of: forming a first conductive layer on an insulating surface: forming a second conductive layer on the first conductive layer; forming a third conductive layer on the second conductive layer, and etching the first to third conductive layers to form a conductive layer with a taper portion.

In the above-mentioned constitution, the process of forming the wiring is characterized in that a conductive film mainly containing W, a conductive film mainly containing Al, and a conductive film mainly containing Ti are stacked on top of each other, followed by etching with a mask. Furthermore, in the above-mentioned constitution, the process of forming the wiring is characterized in that a conductive film mainly containing Mo, a conductive film mainly containing Al, and a conductive film mainly containing Ti are stacked on top of each other followed by etching with a mask.

Furthermore, by allowing the wiring to have a layered structure including the above-mentioned conductive layers, the edges of the wiring are tapered by using an ICP etching method or the like. By tapering the edges of the wiring, coverage of films to be formed in the later processes can be made satisfactory.

In the above-mentioned constitution, the edges of the first conductive layer are desirably tapered. A portion having a taper shape (i.e., a taper portion) is a region that is not overlapped with the second conductive layer, and the width of the region corresponds to that obtained by subtracting the second width from the first width. It is also desirable that the second conductive layer is tapered, and the taper angle thereof is made larger than that of the taper portion of the first conductive layer. Furthermore, it is desirable that the third conductive layer is tapered and the taper angle thereof is made substantially the same as that of the taper portion of the second conductive layer.

According to the present invention, a low resistance can be realized in wiring by a simple method suitable for processes of manufacturing conventional wiring or wiring board. Therefore, a degree of design freedom and an aperture ratio in a pixel portion can be enhanced. Since wiring includes conductive layers with a taper shape, satisfactory coverage is obtained. Because of such advantages in a semiconductor device represented by an active matrix type liquid crystal display device, the present invention is fully ready for enlargement of a screen caused by an increased area of a pixel portion, which allows the operation characteristics and reliability of the semiconductor device to be enhanced.

These and other advantages of the present invention will become apparent to those skilled in the art upon reading and understanding the following detailed description with reference to the accompanying drawings.

BRIEF DESCRIPTION OF THE DRAWINGS

In the accompanying drawings:

FIGS. 8A to 8C are cross-sectional views illustrating processes of manufacturing a pixel TFT and a TFT of a driving circuit;

FIGS. 9A to 9C are cross-sectional views illustrating processes of manufacturing a pixel TFT and a TFT of a driving circuit;

FIGS. 18A and 18B are cross-sectional views illustrating processes of manufacturing an active matrix type liquid crystal display device;

DESCRIPTION OF THE PREFERRED EMBODIMENTS

Figure 1A:
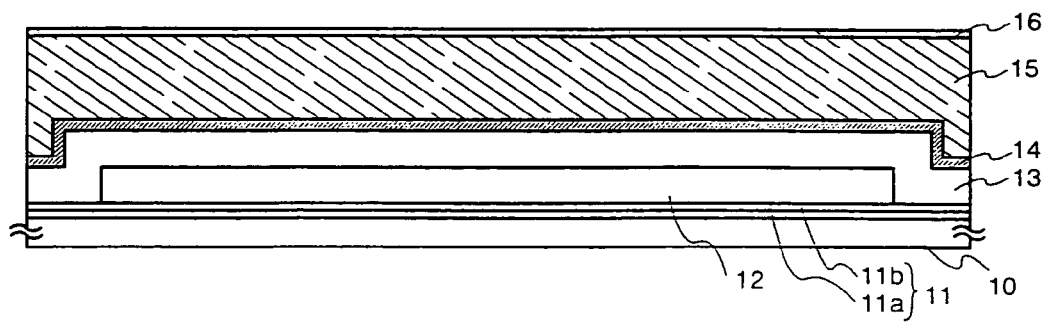
FIGS. 1A to 1C show an exemplary concept of the present invention.
Figure 1B:
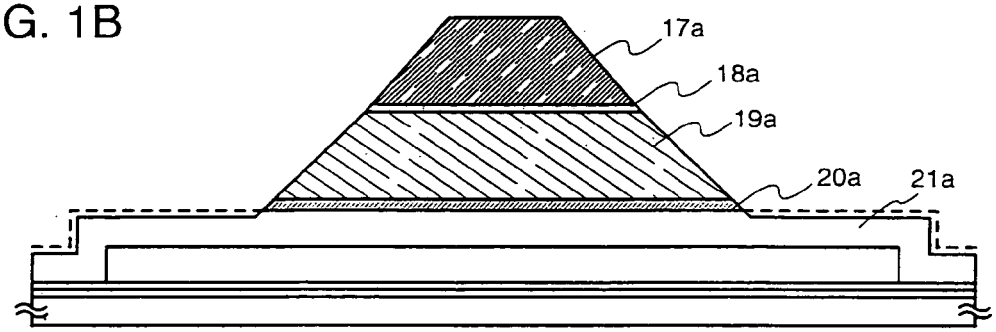

Hereinafter, the present invention will be described by way of an illustrative embodiment with reference to FIGS. 1A to 1C. In the present embodiment a wiring board provided with a gate electrode of a TFT utilizing the present invention will be described.

First, a base insulating film 11 is formed on a substrate 10. As the substrate 10, a glass substrate, a quartz substrate, a silicon substrate, a plastic substrate, a metal substrate, a flexible substrate, or the like can be used. Examples of the glass substrate include those which are made of glass such as barium borosilicate glass or aluminoborosilicate glass. Furthermore, the flexible substrate refers to a film-shaped substrate made of PET, PES, PEN, acrylic resin or the like. If a semiconductor device is manufactured by using a flexible substrate, lightweight can be expected. A barrier layer such as an Al film (AlON, AlN, AlO, etc.), a carbon film (diamond-like carbon (DLC), etc.), or an SiN film is desirably formed on a front surface or on both a front surface and a back surface of a flexible substrate as a single layer or a multi-layer in order to enhance durability.

Furthermore, as the base insulating film 11, a base film 11 made of an insulating film such as a silicon oxide film, a silicon nitride film, or a silicon oxynitride film is formed. Herein, the base film 11 with a double-layered structure (11a, 11b) is exemplified; however, the base film 11 may be a single-layer film of the insulating film or may have a multi-layered structure of two or more layers. Note that the base insulating film may not be formed.

Then, a semiconductor layer 12 is formed on the base insulating film 11. The semiconductor layer 12 is obtained by forming a semiconductor film with an amorphous structure by a known method (sputtering, LPCVD, plasma CVD, etc.), crystallizing the semiconductor film by known crystallization (laser crystallization, thermal crystallization, thermal crystallization using a catalyst such as nickel, etc.), and patterning the crystalline semiconductor film to have a desired shape using a first photomask. The semiconductor layer 12 is formed to a thickness of 25 to 80 nm (preferably, 30 to 60 nm). There is no particular limit to a material for the crystalline semiconductor film; however, the crystalline semiconductor film may be preferably formed of silicon, a silicon-germanium (SiGe) alloy, or the like.

Then, an insulating film 13 is formed so as to cover the semiconductor layer 12. The insulating film 13 is formed to have a thickness of 40 to 150 nm so as to have a single-layered structure or a multi-layered structure of an insulating film containing silicon by plasma CVD or sputtering. The insulating film 13 is to be a gate insulating film.

Next, a first conductive film 14 (thickness: 20 to 100 nm), a second conductive film 15 (thickness: 100 to 800 nm), and a third conductive film 16 (thickness: 20 to 100 nm) are layered on the insulating film 13. Herein, these conductive films may be formed by sputtering, plasma CVD, or the like, and as the first conductive film 14 contacting the insulating film 13, a conductive film (W. WMo, Mo, etc.) mainly containing W or Mo may be used so as to prevent diffusion of impurities from the substrate 10 to a channel formation region. Furthermore as the second conductive film 15, a low-resistant conductive film (Al, Al—Ti, Al—Sc, Al—Si, etc.) mainly containing Al may be used. As the third conductive film 16, a conductive film mainly containing Ti (Ti, TiN, etc.) with a low contact resistance may be used.

Then, a resist mask 17a is formed using a second photomask, and a first etching process is conducted in an inductively coupled plasma (ICP) etching apparatus or the like. Due to the first etching process, the first to third conductive films 14 to 16 are etched to obtain conductive layers 18a to 20a having taper portions at edges as shown in FIG. 1B.

A second etching process is conducted in an ICP etching apparatus or the like, using the resist mask 17a formed in a second photolithography process as it is. Due to the second etching process, the second conductive layer 19a and the third conductive layer 18a are selectively etched to obtain a second conductive layer 19b and a third conductive layer 18b as shown in FIG. 1C. During the second etching process, the resist mask 17a, the first conductive layer 20a, and the insulating film 13 are slightly etched to form a resist mask 17b, a first conductive layer 20b, and an insulating film 21b. The first conductive layer 20b has a first width (W1), the second conductive layer 19b has a second width (W2), and the third conductive layer 18b has a third width (W3). The first width is larger than the second width, and the second width is larger than the third width.

Herein, in order to suppress film reduction of the insulating film 13, etching is conducted twice (first and second etching processes). However, as long as an electrode structure (layered structure of the third conductive layer 18b, the second conductive layer 19b, and the first conductive layer 20b) as shown in FIG. 1C can be formed, there is no particular limit. Etching may be conducted once.

As described above, according to the present invention, a gate line is formed of low-resistant conductive layers. Therefore, even if the area of a pixel portion is enlarged, the pixel can be sufficiently driven. Needless to say, the present invention is applicable to various wiring as well as a gate line, and a wiring board with the wiring formed thereon can be manufactured. Furthermore, according to the present invention, operation characteristics and reliability of a semiconductor device with such wiring formed thereon can be enhanced.

The present invention with the above-mentioned constitution will be described in detail by way of the following embodiments.

EMBODIMENTS

The present invention will be described by way of embodiments; however, it should be noted that the present invention is not limited thereto.

Embodiment 1

An exemplary structure of a wiring board provided with a gate electrode using the present invention will be described below.

First, a base insulating film 11 is formed on a substrate 10. As the substrate 10, a glass substrate, a quartz substrate, a silicon substrate, or a metal substrate or a flexible substrate with an insulating film formed thereon may be used. Furthermore, a plastic substrate having heat resistance withstanding a treatment temperature may be used. In the present embodiment, a glass substrate (1737 produced by Corning Co.) was used.

As the base insulating film 11, a base film 11 made of an insulating film such as a silicon oxide film, a silicon nitride film, or a silicon oxynitride film is formed. Herein, the base film 11 with a double-layered structure (11a, 11b) is exemplified; however, the base film 11 may be a single-layer film of the insulating film or may have a multi-layered structure of two or more layers. Note that the base insulating film may not be formed. In the present embodiment, a silicon oxynitride film 11a with a thickness of 50 nm (composition ratio: Si=32%. O=27%, N=24%, H=17%) was formed. Then, a silicon oxynitride film 11b with a thickness of 100 nm (composition ratio: Si=32%. O=59%. N=7%. H=2%) was formed.

Then, a semiconductor layer 12 is formed on the base insulating film 11. The semiconductor layer 12 is obtained by forming a semiconductor film with an amorphous structure by a known method (sputtering, LPCVD, plasma CVD, etc.), crystallizing the semiconductor film by known crystallization (laser crystallization, thermal crystallization, thermal crystallization using a catalyst such as nickel, etc.), and patterning the crystalline semiconductor film to a desired shape using a first photomask. The semiconductor layer 12 is formed to have a thickness of 25 to 80 nm (preferably, 30 to 60 nm). There is no particular limit to a material for the crystalline semiconductor film; however, the crystalline semiconductor film may be preferably formed of silicon, a silicon-germanium (SiGe) alloy, or the like. In the present embodiment, an amorphous silicon film was formed to have a thickness of 55 nm by plasma CVD, and a solution containing nickel was held on the amorphous silicon film. The amorphous silicon film was dehydrogenated at 500° C. for one hour, and subjected to thermal crystallization at 550° C. for 4 hours. A laser annealing process for improving crystallization was conducted to form a crystalline silicon film. The crystalline silicon film was patterned by photolithographer to form a semiconductor layer 12.

Then, an insulating film 13 is formed so as to cover the semiconductor layer 12. The insulating film 13 is formed to have a thickness of 40 to 150 nm by plasma CVD or sputtering so as to have a single-layered structure or a multi-layered structure of an insulating film containing silicon. The insulating film 13 is to be a gate insulating film. In the present embodiment, a silicon oxynitride film (composition ratio: Si=32%, O=59%, N=7%, H=2%) was formed to have a thickness of 110 nm by plasma CVD.

Next, a first conductive film 14 (thickness: 20 to 100 nm), a second conductive film 15 (thickness: 100 to 800 nm), and a third conductive film 16 (thickness: 20 to 100 nm) are layered on the insulating film 13. Herein, these conductive films may be formed by sputtering or the like, and as the first conductive film 14 contacting the insulating film 13, a conductive film (W, WMo, Mo, etc.) mainly containing W or Mo may be used so as to prevent diffusion of impurities from the substrate 10 to a channel formation region. Furthermore, as the second conductive film 15, a low-resistant conductive film (Al, Al—Ti, Al—Sc, Al—Si, etc.) mainly containing Al may be used. As the third conductive film 16, a conductive film mainly containing Ti (Ti, TiN, etc.) with a low contact resistance may be used. In the present embodiment, a first conductive film 14 made of a W film (thickness: 30 nm), a second conductive film 15 made of an Al—Ti film (thickness: 500 nm), and a third conductive film 16 made of a Ti film (thickness: 50 nm) were layered by sputtering. The ratio of Ti of the second conductive film 15 was 1%, and the second conductive film 15 was formed using Al—Ti as a target.

Figure 22:
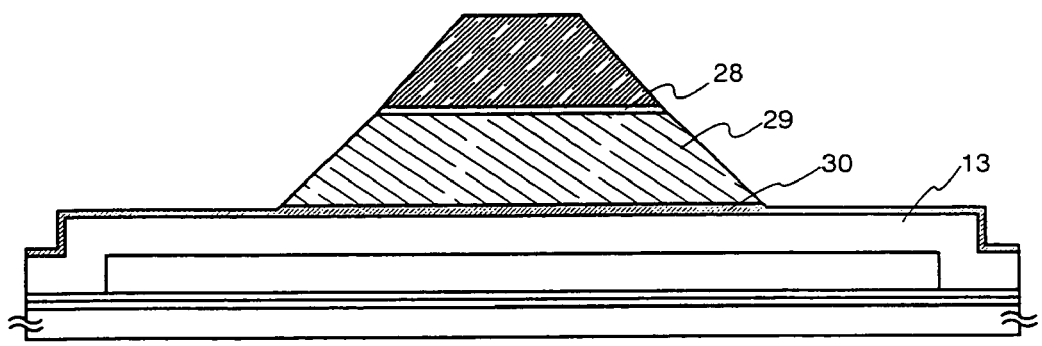
FIG. 22 schematically shows the shape of wiring produced according to the first etching condition.

Then, a first etching process is conducted. The first etching process is conducted under first etching condition and second etching condition. In the present embodiment, under the first etching condition, an ICP etching method was used. More specifically, etching was conducted for 147 seconds by generating plasma, using $BCl_3$, $Cl_2$, and $O_2$ as an etching gas in a gas flow rate of 65:10:5 (sccm) with an RF (13.56 MHz) power of 450 W supplied to a coil-shaped electrode under a pressure of 1.2 Pa. Herein, a dry etching apparatus (Model E645-ICP) using ICP produced by Matsushita Electric Industrial Co., Ltd. was used. An RF (13.56 MHz) power of 300 W is also supplied to a substrate side (sample stage), whereby a substantially negative self-bias voltage is applied thereto. Under the first etching condition, an etching speed with respect to the resist is 235.5 nm/min, an etching speed with respect to Al—Ti is 233.4 nm/min, and an etching speed with respect to W is 133.8 nm/min. The etching speed with respect to Ti is almost the same as that of Al—Ti. As shown in FIG. 22, the Al—Ti film and the Ti film are etched by the first etching condition to obtain a second conductive film 29 and a third conductive film 28. Under the first etching condition, the Al—Ti film and the Ti film are etched to taper the edges of second and third conductive layers. Furthermore, under the first etching condition, the taper angle of the Al—Ti film and the Ti film becomes about 45°. Because the etching speed with respect to W is much smaller than that of resist, T, and Al—Ti, a surface of the first conductive film 14 is mainly etched to form a shape denoted by a reference numeral 30.

Thereafter, the etching condition is changed to the second etching condition without removing the resist mask 17a. Under the second etching condition, etching was conducted for 30 seconds by generating plasma, using $CF_4$, $Cl_2$, and $O_2$ as an etching gas in a gas flow rate of 25:25:10 (sccm) with an RF (13.56 MHz) power of 500 W supplied to a coil-shaped electrode under a pressure of 1 Pa. An RF (13.56 MHz) power of 20 W is also supplied to a substrate side (sample stage), whereby a substantially negative self-bias voltage is applied thereto. Under the second etching condition in which $CF_4$, $Cl_2$, and $O_2$ are mixed, only the W film is etched. The etching speed with respect to W under the second etching condition is 124.6 nm/min. In order to conduct etching without leaving a residue on a gate insulating film, an etching time may be increased by about 10 to 20%.

Figure 2A:
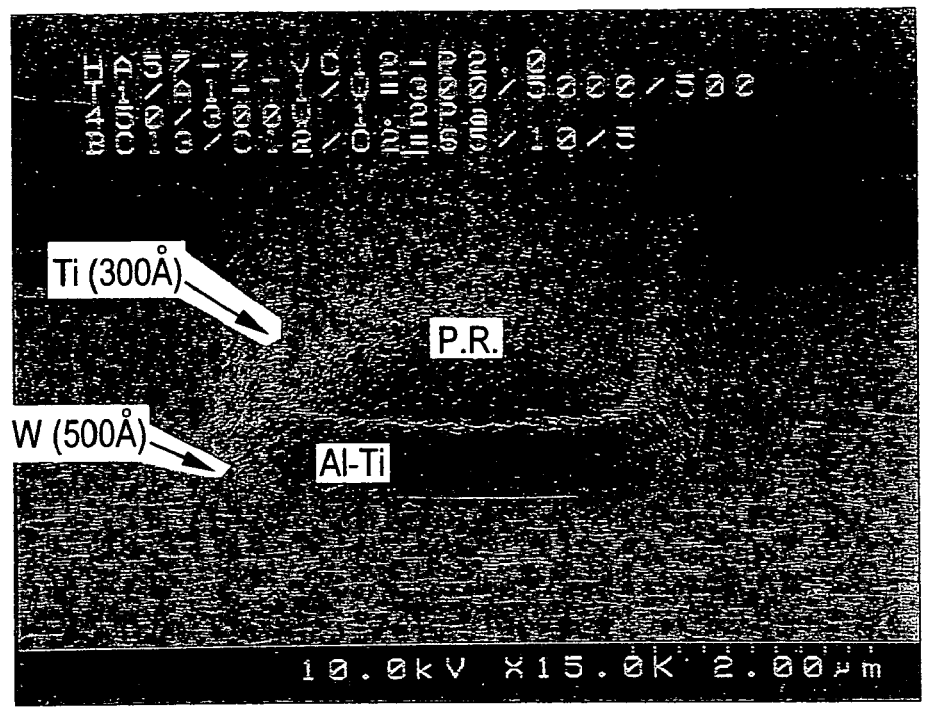
FIGS. 2A and 2B show an exemplary shape of wiring produced according to the present invention.

In the first etching process, by making the shape of a resist mask appropriate, the edges of the first and second conductive layers are tapered due to the effect of a bias voltage applied to the substrate side. The taper angle may be set to be 15° to 45°. Accordingly, a first-shaped conductive layer composed of the first conductive layer 20a, the second conductive layer 19a, and the third conductive layer 18a is formed by the first etching process. The width of the first conductive layer 20a in a channel length direction corresponds to W1 shown in the above-mentioned embodiment mode. Reference numeral 21a denotes a gate insulating film, and regions of the gate insulating film 21a not covered with the first-shaped conductive layer are slightly etched by about 20 to 50 nm. The first etching process herein corresponds to the first etching process (FIG. 1B) described in the above-mentioned embodiment mode. FIG. 2A shows an SEM photograph of the first-shaped conductive layer thus formed.

Then, a second etching process is conducted without removing a resist mask. Herein, etching was conducted by generating plasma, using $BCl_3$ and $Cl_2$ as an etching gas in a gas flow rate of 20:60(sccm) with an RF (13.56 MHz) power of 600 W supplied to a coil-shaped electrode under a pressure of 1.2 Pa. An RF (13.56 MHz) power of 100 W is also supplied to the substrate side (sample stage), whereby a substantially negative self-bias voltage is applied thereto. In the second etching process, the Al—Ti film and the Ti film are selectively etched. Due to the second etching process, the taper angle of the Al—Ti film and the Ti film became 80°. During the second etching process, a second conductive layer 19b and a third conductive layer 18b are formed. On the other hand, the first conductive layer 20a is hardly etched compared to the second conductive layer 19b and the third conductive layer 18b to form a first conductive layer 20b. The second etching process herein corresponds to the second etching process (FIG. 1C) described in the above-mentioned embodiment mode. Accordingly, a second-shaped conductive layer was formed, which is composed of the first conductive layer with a width of W1 in a channel length direction, the second conductive layer with a width of W2 therein, and the third conductive layer with a width of W3 therein. FIG. 2B shows an SEM photograph of the second-shaped conductive layer.

Table 4 shows the results obtained by calculating a thickness (nm) of an underlying film to be etched, in the case where an etching rate of a film formed under the Al—Ti film with respect to the Al—Ti film is 2 to 10, considering an in-plane variation of the etching rate of the Al—Ti film. At this time, the thickness was calculated assuming that that the thickness of the Al—Ti film is 500 nm, and there is ±5% variation in a plane.

Embodiment 2

In the present embodiment, the case where the first etching condition in the first etching process in Embodiment 1 is changed will be described with reference to FIGS. 3A-3B to 6A-6C. Herein, since the first etching condition is changed, only two layers (second and third conductive layers) in Embodiment 1 constitute a gate line. However, the present invention is also applicable to the case where a gate line is composed of three layers using the first conductive layer in Embodiment 1 as a lower layer.

Figure 3A:
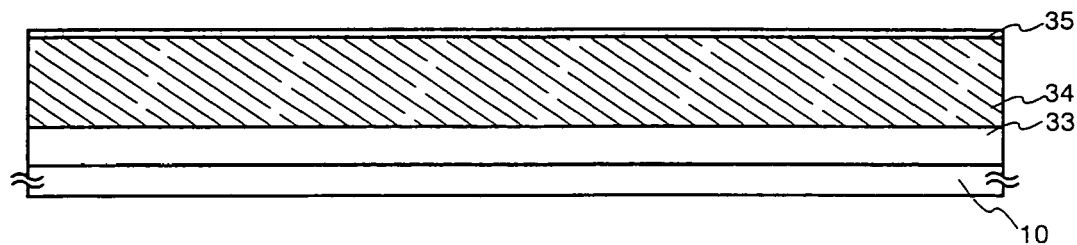
FIGS. 3A and 3B schematically show the shape of wiring produced according to the present invention.

First, an oxynitride film 33 is formed to have a thickness of 200 nm on a 1737 glass substrate 10 by sputtering. Then, a first conductive film 34 made of an Al—Ti film (thickness: 500 nm) and a second conductive film 35 made of a Ti film (thickness: 100 nm) were layered by sputtering (FIG. 3A).

Figure 3B:
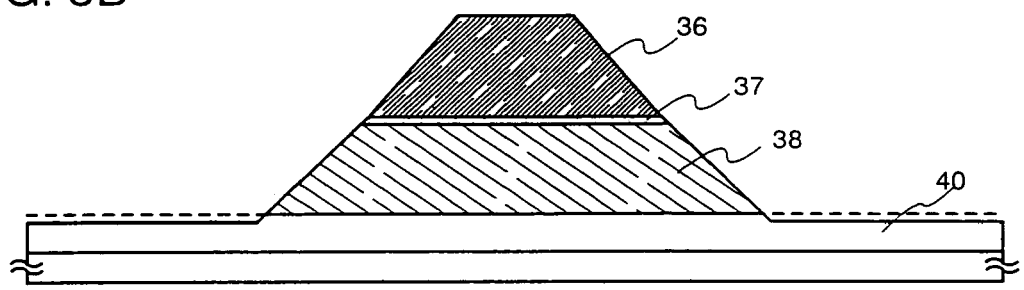

Then, an etching process is conducted after forming a resist on the second conductive film 35. This etching process is conducted under the first etching condition in Embodiment 1. In the present embodiment, an ICP etching method was used, and $BCl_3$ and $Cl_2$ were used as an etching gas under a pressure of 1.2 Pa. Etching was conducted by varying a gas flow rate and an electric power supplied to a coil-shaped electrode and a substrate side (sample stage) as shown in Table 5 (FIG. 3B). Due to this etching process, a resist, the second conductive film 35, and the first conductive film was etched to form a second conductive layer 37, a first conductive layer 38, and further an oxynitride film 40. A reference numeral 36 denotes a resist after the etching process.

TABLE 4

| variation in an etching rate with respect to the Al—Ti film (±%) | selection ratio with respect to the underlying film | | | | | | | | |
|---|---|---|---|---|---|---|---|---|---|
| | 2 | 3 | 4 | 5 | 6 | 7 | 8 | 9 | 10 |
| 1 | 300.0 | 200.0 | 150.0 | 120.0 | 100.0 | 85.7 | 75.0 | 66.7 | 60.0 |
| 2 | 350.1 | 233.4 | 175.1 | 140.1 | 116.7 | 100.0 | 87.5 | 77.8 | 70.0 |
| 3 | 400.4 | 266.9 | 200.2 | 160.1 | 133.5 | 114.4 | 100.1 | 89.0 | 80.1 |
| 4 | 450.7 | 300.5 | 225.4 | 180.3 | 150.2 | 128.8 | 112.7 | 100.2 | 90.1 |
| 5 | 501.3 | 334.2 | 250.6 | 200.5 | 167.1 | 143.2 | 125.3 | 111.4 | 100.3 |
| 6 | 552.0 | 368.0 | 276.0 | 220.8 | 184.0 | 157.7 | 138.0 | 122.7 | 110.4 |
| 7 | 603.0 | 402.0 | 301.5 | 241.2 | 201.0 | 172.3 | 150.7 | 134.0 | 120.6 |
| 8 | 654.2 | 436.1 | 327.1 | 261.7 | 218.1 | 186.9 | 163.5 | 145.4 | 130.8 |
| 9 | 705.7 | 470.5 | 352.9 | 282.3 | 235.2 | 201.6 | 176.4 | 156.8 | 141.1 |
| 10 | 757.6 | 505.1 | 378.8 | 303.0 | 252.5 | 216.5 | 189.4 | 168.4 | 151.5 |
| 11 | 809.8 | 539.9 | 404.9 | 323.9 | 269.9 | 231.4 | 202.4 | 180.0 | 162.0 |
| 12 | 862.4 | 574.9 | 431.2 | 345.0 | 287.5 | 246.4 | 215.6 | 191.6 | 172.5 |
| 13 | 915.5 | 610.3 | 457.7 | 366.2 | 305.2 | 261.6 | 228.9 | 203.4 | 183.1 |
| 14 | 969.0 | 646.0 | 484.5 | 387.6 | 323.0 | 276.9 | 242.2 | 215.3 | 193.8 |
| 15 | 1023.0 | 682.0 | 511.5 | 409.2 | 341.0 | 292.3 | 255.8 | 227.3 | 204.6 |

As shown in Table 4, as the variation in an etching rate with respect to the Al—Ti film is increased, the thickness to be etched becomes larger. Furthermore, as a selection ratio with respect to the underlying film is increased, the thickness to be etched becomes thinner. If these characteristics are utilized, wiring with a desired shape can be formed.

As described above, according to the present invention, since a gate line is formed of low-resistant conductive layers, even if the area of a pixel portion is enlarged, the pixel can be sufficiently driven. Furthermore, operation characteristics and reliability of a semiconductor device with such wiring formed thereon can be enhanced.

TABLE 5

| condition | ICP (W) | Bias (W) | gas | flow rate (sccm) | etching time (sec.) |
|---|---|---|---|---|---|
| 1 | 100 | 300 | $BCl_3$:$Cl_2$ | 60:20 | 268 |
| 2 | 300 | 300 | $BCl_3$:$Cl_2$ | 60:20 | 168 |
| 3 | 700 | 300 | $BCl_3$:$Cl_2$ | 60:20 | 159 |
| 4 | 500 | 100 | $BCl_3$:$Cl_2$ | 60:20 | 175 |
| 5 | 500 | 200 | $BCl_3$:$Cl_2$ | 60:20 | 147 |
| 6 | 500 | 400 | $BCl_3$:$Cl_2$ | 60:20 | 147 |

TABLE 5-continued

| condition | ICP (W) | Bias (W) | gas | flow rate (sccm) | etching time (sec.) |
|---|---|---|---|---|---|
| 7 | 500 | 300 | $BCl_3:Cl_2$ | 20:60 | 60 |
| 8 | 500 | 300 | $BCl_3:Cl_2$ | 40:40 | 81 |
| 9 | 500 | 300 | $BCl_3:Cl_2$ | 70:10 | 350 |

Figure 4A:
FIGS. 4A to 4C show an exemplary shape of wiring produced according to the present invention.
Figure 4B:
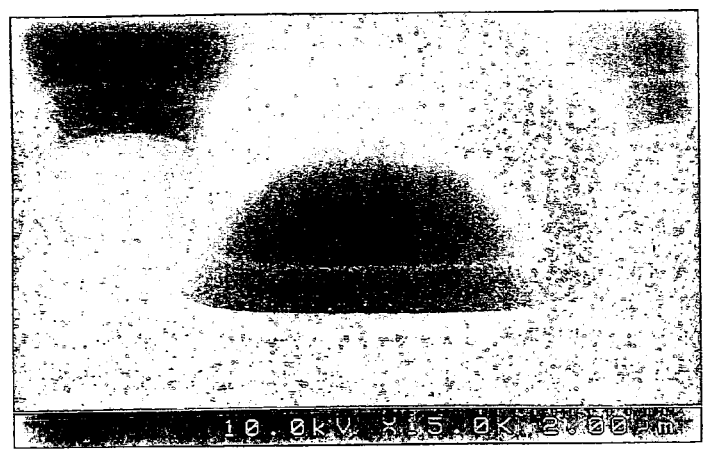
Figure 4C:
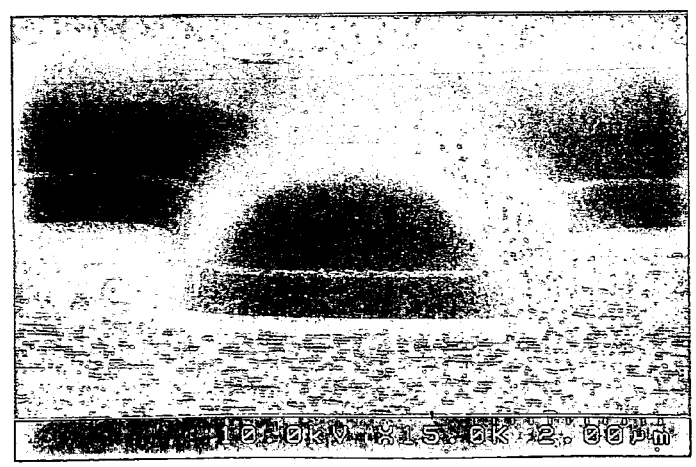
Figure 5A:
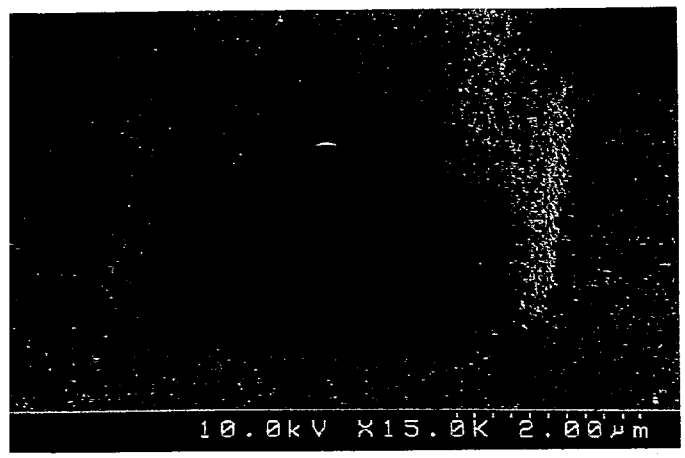
FIGS. 5A to 5C show an exemplary shape of wiring produced according to the present invention.
Figure 5B:
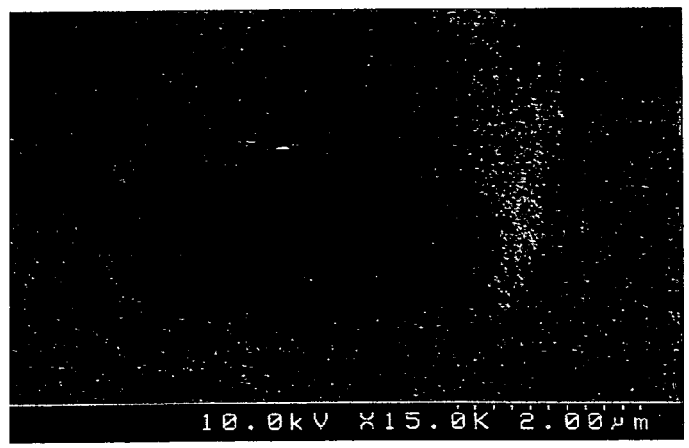
Figure 5C:
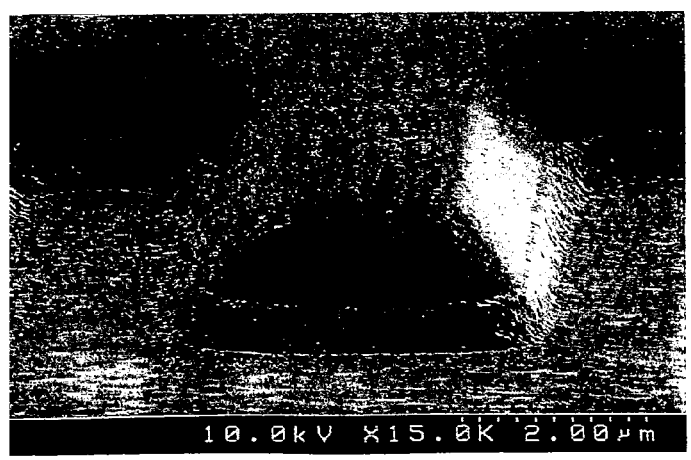
Figure 6A:
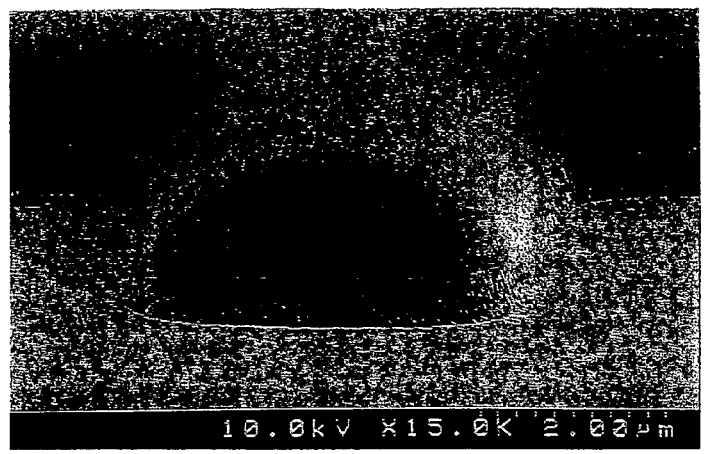
FIGS. 6A to 6C show an exemplary shape of wiring produced according to the present invention.
Figure 6B:
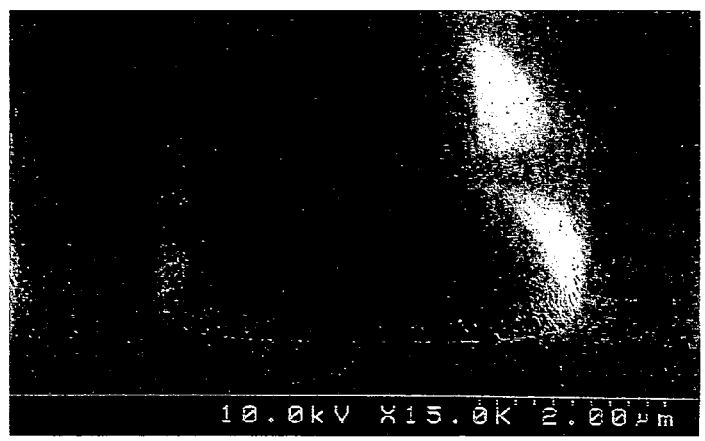
Figure 6C:
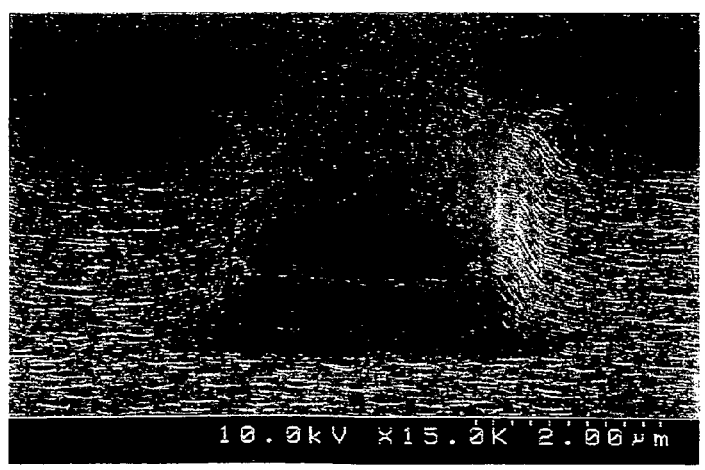

FIGS. 4A-4C to 6A-6C show configurations of conductive layers obtained under the conditions shown in Table 5, observed by a factor of 15000 with an SEM. FIG. 4A shows a conductive layer formed under Condition 1. FIG. 4B shows a conductive layer formed under Condition 2. FIG. 4C shows a conductive layer formed under Condition 3. FIG. 5A shows a conductive layer formed under Condition 4. FIG. 5B shows a conductive layer formed under Condition 5. FIG. 5C shows a conductive layer formed under Condition 6. FIG. 6A shows a conductive layer formed under Condition 7. FIG. 6B shows a conductive layer formed under Condition 8. FIG. 6C shows a conductive layer formed under Condition 9. It is understood from FIGS. 4A to 4C that as an electric power supplied to a coil-shaped electrode is increased, a taper angle becomes larger. It is understood from FIGS. 5A to 5C that as an electric power supplied to a substrate side is increased, a taper angle becomes larger. It is understood from FIGS. 6A to 6C that as a gas flow rate of $BCl_3$ is increased, a taper angle becomes larger. Thus, a taper angle is varied depending upon the condition. Furthermore, Table 6 shows etching rates obtained under the conditions shown in Table 5. Table 7 shows a selection ratio with respect to each film. Anisotropic etching is made possible under the condition that a selection ratio between Al—Ti and W is large, whereby a conductive layer with a desired shape can be formed.

As described above, by varying the condition, a conductive layer with a desired shape can be obtained. Furthermore, even if the area of a pixel portion is enlarged, a pixel can be sufficiently driven. Operation characteristics and reliability of a semiconductor device with such wiring formed thereon can be enhanced.

Embodiment 3

Figure 17A:
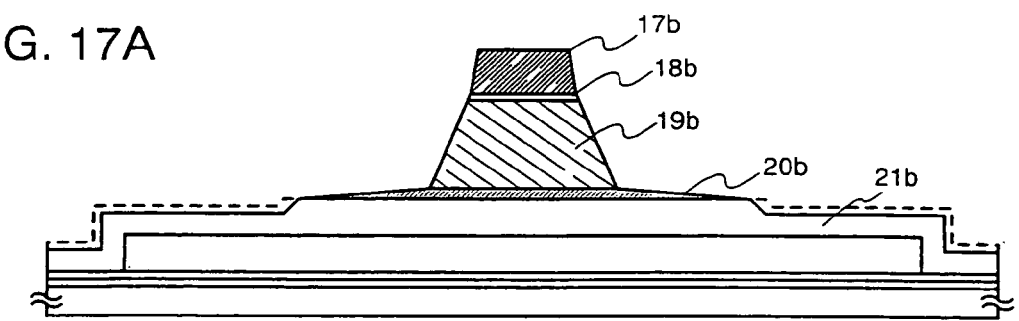
FIGS. 17A and 17B show an exemplary concept of the present invention.

In the present embodiment, the case where a plasma treatment is conducted to the wiring formed in Embodiment 1 will be described with reference to FIGS. 17A and 17B. In the present specification, a plasma treatment refers to exposing a sample to an atmosphere in which a gas is subjected to plasma treatment.

Figure 1C:
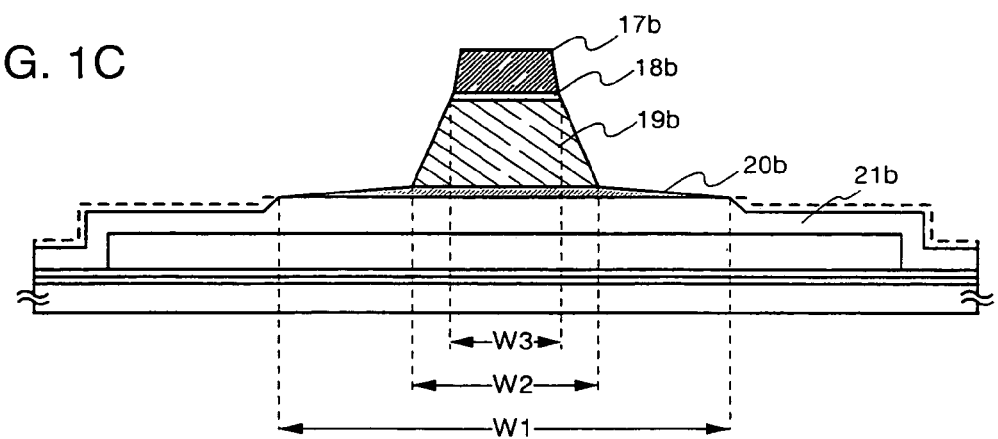
Figure 2B:
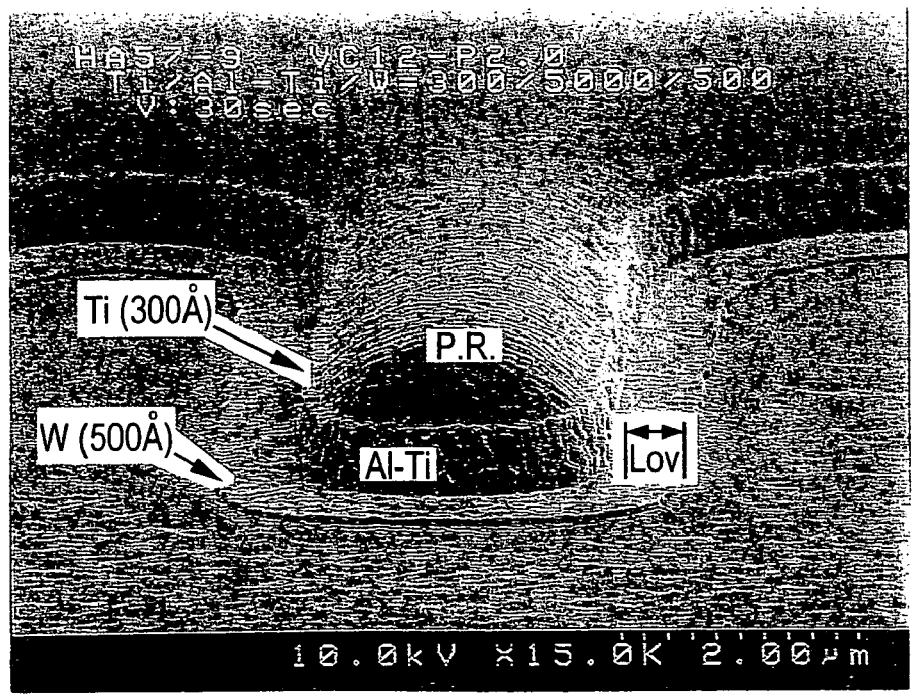

First, in accordance with Embodiment 1, the state shown in FIG. 1C is obtained. FIG. 17A and FIG. 1C show the same state, and corresponding portions are denoted with the same reference numerals.

Figure 17B:
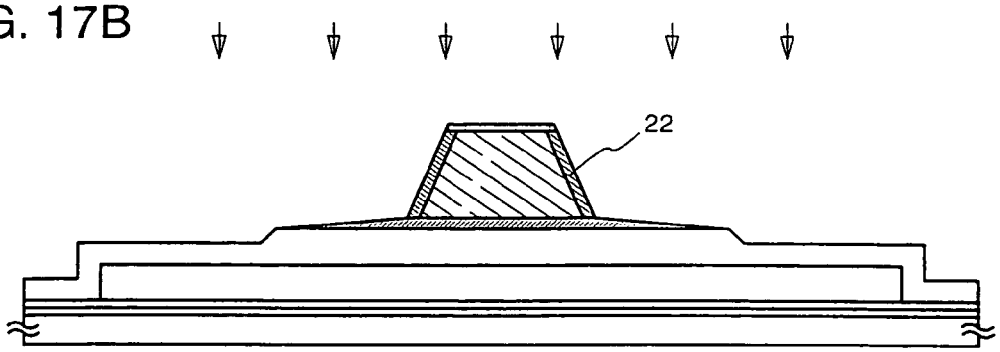

The wiring thus formed is subjected to a plasma treatment using oxygen, a gas mainly containing oxygen, or $H_2O$ (FIG. 17B). The plasma treatment is conducted for 30 seconds to 20 minutes (preferably, 3 to 15 minutes) using a plasma generating apparatus (plasma CVD apparatus, dry etching apparatus, sputtering apparatus, etc.). Furthermore, it is desirable that the wiring is treated under the condition of a gas flow rate of 50 to 300 sccm, a substrate temperature of room temperature to 200° C., and an RF of 100 to 2000 W. Due to the plasma treatment, the second conductive layer 19b composed of a conductive layer made of Al, or an alloy or a compound mainly containing Al is likely to be oxidized among the conductive layers constituting a three-layered structure. Therefore, portions 22 of the second conductive layer 19b, which is not in contact with the other conductive layers, are

TABLE 6

| condition | ICP (W) | Bias (W) | flow rate (sccm) | Al—Si (nm/min) (Ave) | (3σ) | resist (nm/min) (Ave) | (3σ) | W (nm/min) (Ave) | (3σ) | SiON (nm/min) (Ave) | (3σ) |
|---|---|---|---|---|---|---|---|---|---|---|---|
| 1 | 100 | 300 | 60:20 | 168.8 | 39.3 | 122.4 | 33.1 | 37.1 | 6.4 | 38.4 | 8.1 |
| 2 | 300 | 300 | 60:20 | 236.9 | 51.4 | 197.9 | 36.7 | 59.4 | 16.2 | 66.4 | 8.9 |
| 3 | 700 | 300 | 60:20 | 262.1 | 63.2 | 263.1 | 33.2 | 110.7 | 23.1 | 107.6 | 12.0 |
| 4 | 500 | 100 | 60:20 | 236.7 | 40.6 | 133.7 | 26.3 | 41.4 | 17.0 | 56.0 | 8.2 |
| 5 | 500 | 200 | 60:20 | 246.8 | 46.1 | 199.6 | 23.7 | 69.1 | 22.3 | 81.8 | 8.8 |
| 6 | 500 | 400 | 60:20 | 251.0 | 55.2 | 255.3 | 24.4 | 102.6 | 21.3 | 104.0 | 13.4 |
| 7 | 500 | 300 | 20:60 | 750.7 | 111.0 | 395.2 | 70.7 | 127.8 | 49.9 | 104.0 | 17.6 |
| 8 | 500 | 300 | 40:40 | 495.6 | 116.5 | 351.1 | 62.2 | 112.4 | 39.4 | 101.0 | 16.8 |
| 9 | 500 | 300 | 70:10 | 142.3 | 24.2 | 148.6 | 17.7 | 61.0 | 10.8 | 99.3 | 9.7 |

TABLE 7

| condition | selection ratio with respect to Al—Si | | | selection ratio with respect to resist | | | selection ratio with respect to W | | | selection ratio with respect to SiON | | |
|---|---|---|---|---|---|---|---|---|---|---|---|---|
| | resist | W | SiON | Al—Si | W | SiON | Al—Si | resist | SiON | Al—Si | resist | W |
| 1 | 1.38 | 4.55 | 4.40 | 0.73 | 3.30 | 3.19 | 0.22 | 0.30 | 0.97 | 0.23 | 0.31 | 1.03 |
| 2 | 1.20 | 3.99 | 3.57 | 0.84 | 3.33 | 2.98 | 0.25 | 0.30 | 0.89 | 0.28 | 0.34 | 1.12 |
| 3 | 1.00 | 2.37 | 2.44 | 1.00 | 2.38 | 2.45 | 0.42 | 0.42 | 1.03 | 0.41 | 0.41 | 0.97 |
| 4 | 1.77 | 5.72 | 4.23 | 0.56 | 3.23 | 2.39 | 0.17 | 0.31 | 0.74 | 0.24 | 0.42 | 1.35 |
| 5 | 1.24 | 3.57 | 3.02 | 0.81 | 2.89 | 2.44 | 0.28 | 0.35 | 0.85 | 0.33 | 0.41 | 1.18 |
| 6 | 0.98 | 2.45 | 2.41 | 1.02 | 2.49 | 2.46 | 0.41 | 0.40 | 0.99 | 0.41 | 0.41 | 1.01 |
| 7 | 1.90 | 5.88 | 7.22 | 0.53 | 3.09 | 3.80 | 0.17 | 0.32 | 1.23 | 0.14 | 0.26 | 0.81 |
| 8 | 1.41 | 4.41 | 4.91 | 0.71 | 3.12 | 3.47 | 0.23 | 0.32 | 1.11 | 0.20 | 0.29 | 0.90 |
| 9 | 0.96 | 2.33 | 1.43 | 1.04 | 2.44 | 1.50 | 0.43 | 0.41 | 0.61 | 0.70 | 0.67 | 1.63 | oxidized. This enables formation of projections such as hillock and whisker to be further reduced.

Needless to say, if ashing is conducted using oxygen or a gas mainly containing oxygen, or $H_2O$ in order to remove the resist 17b, the exposed portions of the second conductive layer 19b are oxidized. However a sufficient oxide film is more likely to be formed when a plasma treatment is conducted after removing the resist 17b.

As described above, according to the present invention a gate line is formed of low-resistant conductive layers. Therefore, even if the area of a pixel portion is enlarged, a pixel can be sufficiently driven. Furthermore, operation characteristics and reliability of a semiconductor device with such wiring formed thereon can be enhanced.

Embodiment 4

Figure 7A:
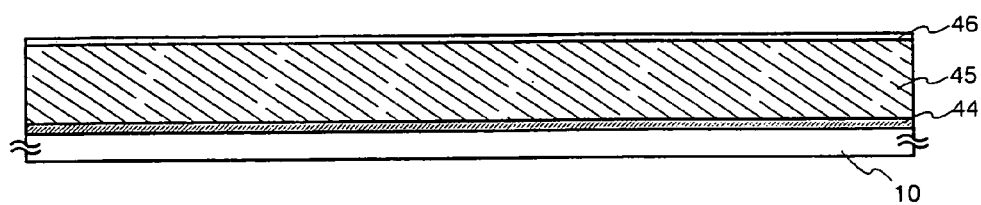
FIGS. 7A to 7C show an exemplary concept of the present invention.
Figure 7B:
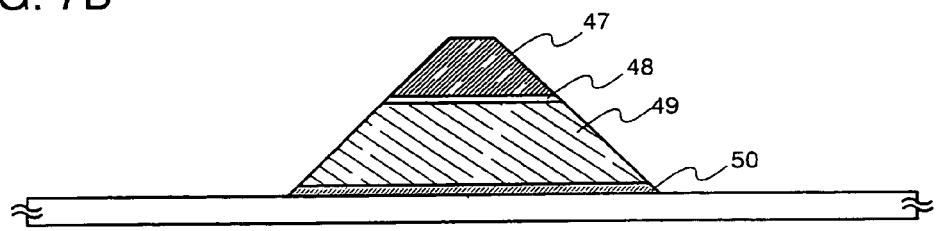
Figure 7C:
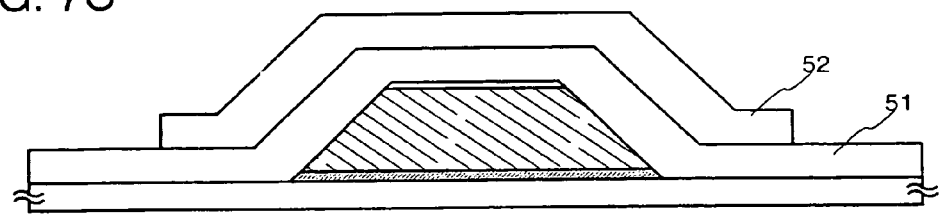

An example of manufacturing a wiring board by applying the present invention to a wiring structure different from those in Embodiments 1 to 3 will be described with reference to FIG. 7.

First, as a substrate 10, a glass substrate, a quartz substrate, a silicon substrate, a metal substrate or a flexible substrate with an insulating film formed thereon may be used. Furthermore, a plastic substrate having heat resistance withstanding a treatment temperature may be used. In the present embodiment, a glass substrate (1737, produced by Corning Co.) is used.

Then, a first conductive film 44 (thickness: 20 to 100 nm), a second conductive film 45 (thickness: 100 to 800 nm), and a third conductive film 46 (thickness: 20 to 100 nm) are layered on the substrate 10. Herein, these conductive films may be formed by sputtering, and as the first conductive film 44 contacting the insulating film, a conductive film mainly containing W or Mo may be used so as to prevent diffusion of impurities from the substrate 10 to a channel formation region. Furthermore, as the second conductive film 45, a low-resistant conductive film mainly containing Al or Cu may be used. As the third conductive film 46, a conductive film mainly containing Ti with a low contact resistance may be used. In the present embodiment, these conductive films may be formed by sputtering, and a first conductive film 44 made of an Mo film (thickness: 30 nm), a second conductive film 45 made of an Al—Ti film (thickness: 500 nm), and a third conductive film 46 made of a Ti film (thickness: 50 nm) are layered.

Then, an etching process is conducted. The etching process is conducted under first etching condition and second etching condition. In the present embodiment, under the first etching condition, an ICP etching method was used. More specifically, etching was conducted by generating plasma, using $BCl_3$, $Cl_2$, and $O_2$ as an etching gas in a gas flow rate of 65:10:5 (sccm) with an RF (13.56 MHz) power of 450 W supplied to a coil-shaped electrode under a pressure of 1.2 Pa. Herein, a dry etching apparatus (Model E645-ICP) using ICP produced by Matsushita Electric Industrial Co., Ltd. was used. An RF (13.56 MHz) power of 300 W is also supplied to a substrate side (sample stage), whereby a substantially negative self-bias voltage is applied thereto. Under the first etching condition, the Al—Ti film and the Ti film are etched to taper the edges of the first conductive layer. Furthermore, under the first etching condition, although the taper angle of the Al—Ti film and the Ti film becomes about 45°, Mo is not etched.

Thereafter, the etching condition is changed to the second etching condition without removing the resist mask 47. Under the second etching condition, etching was conducted by generating plasma, using $CF_4$, $Cl_2$, and $O_2$ as an etching gas in a gas flow rate of 25:25:10 (sccm) with an RF (13.56 MHz) power of 500 W supplied to a coil-shaped electrode under a pressure of 1 Pa. An RF (13.56 MHz) power of 20 W is also supplied to a substrate side (sample stage), whereby a substantially negative self-bias voltage is applied thereto. Under the second etching condition in which $CF_4$, $Cl_2$, and $O_2$ are mixed, only the Mo film is etched. In order to conduct etching without leaving a residue on a gate insulating film, an etching time may be increased by about 10 to 20%.

In the above-mentioned etching process, by making the shape of a resist mask appropriate, the edges of the first and second conductive layers are tapered due to the effect of a bias voltage applied to the substrate side. The taper angle may be set to be 15° to 45°. Accordingly, a conductive layer composed of the first conductive layer 50, the second conductive layer 49, and the third conductive layer 48 is formed by the etching process.

Then, an insulating film 51 is formed so as to cover the conductive layer. The insulating film 51 is formed to have a thickness of 40 to 150 nm by plasma CVD or sputtering so as to have a single-layered structure or a multi-layered structure of an insulating film containing silicon. In the present embodiment, a silicon oxynitride film (composition ratio: Si=32%, O=59%, N=7%, H=2%) is formed to have a thickness of 110 nm by plasma CVD.

Then, a semiconductor layer 52 is formed on the insulating film 51. The semiconductor layer 52 is obtained by forming a semiconductor film with an amorphous structure by a known method (sputtering, LPCVD, plasma CVD, etc.), crystallizing the semiconductor film by known crystallization (laser crystallization, thermal crystallization, thermal crystallization using a catalyst such as nickel, etc.), and patterning the crystalline semiconductor film to a desired shape using a photomask. The semiconductor layer 52 is formed to have a thickness of 25 to 300 nm (preferably, 30 to 150 nm). There is no particular limit to a material for the crystalline semiconductor film; however, the crystalline semiconductor film may be preferably formed of silicon, a silicon-germanium (SiGe) alloy, or the like. In the present embodiment, an amorphous silicon film is formed to have a thickness of 55 nm by plasma CVD, and the amorphous silicon film is subjected to laser annealing process to form a crystalline silicon film. The crystalline silicon film is patterned by photolithography to form the semiconductor layer 52.

As described above, according to the present invention a gate line is formed of low-resistant conductive layers. Therefore, in the case of using a TFT with a reverse-stagger structure, even if the area of a pixel portion is enlarged, a pixel can be sufficiently driven. Furthermore, operation characteristics and reliability of a semiconductor device with such wiring formed thereon can be enhanced.

Embodiment 5

In the present embodiment, as an exemplary wiring board utilizing the present invention, a method of manufacturing an active matrix substrate will be described with reference to FIGS. 8A to 11. In the present specification, a substrate on which a driving circuit having a CMOS circuit and a pixel portion having a pixel TFT and a storage capacitor are formed together will be referred to as an active matrix substrate for convenience.

In the present embodiment, a substrate 400 made of glass such as barium borosilicate glass (e.g., #7059 glass, #1737 glass produced by Corning Co.) or aluminoborosilicate glass is used. As the substrate 400, a quartz substrate, a silicon substrate, or a metal substrate or a flexible substrate with an insulating film formed thereon may be used. Alternatively, a plastic substrate having heat resistance withstanding a treatment temperature of the present embodiment may be used.

Then, a base film 401 composed of an insulating film such as a silicon oxide film, a silicon nitride film, or a silicon oxynitride film is formed on the substrate 400. In the present embodiment, the base film 401 has a double-layered structure; however, the base film 401 may have a single-layered structure or a multi-layered structure of two or more layers of the insulating film. As a lower layer of the base film 401, a silicon oxynitride film 401a is formed to have a thickness of 10 to 200 nm (preferably 50 to 100 nm) using $SiH_4$, $NH_3$, and $N_2O$ as a reaction gas by plasma CVD. In the present embodiment, a silicon oxynitride film 401a with a thickness of 50 nm (composition ratio: Si=32%, O=27%. N=24%, H=17%) was formed. Then, as an upper layer of the base film 401, a silicon oxynitride film 401b is formed to have a thickness of 50 to 200 nm (preferably, 100 to 150 nm) using $SiH_4$ and $N_2O$ as a reaction gas by plasma CVD. In the present embodiment, a silicon oxynitride film 401b with a thickness of 100 nm (composition ratio: Si=32%, O=59%, N=7%, H=2%) is formed.

Then, semiconductor layers 402 to 406 are formed on the base film 401. The semiconductor layers 402 to 406 are obtained by forming a semiconductor film to have a thickness of 25 to 300 nm (preferably 30 to 200 nm) by a known method (sputtering, LPCVD, plasma CVD, or the like), crystallizing the semiconductor film by known crystallization (laser crystallization, thermal crystallization such as thermal annealing using an annealing furnace and rapid thermal annealing (RTA), thermal crystallization using a metal element accelerating crystallization, etc.), and patterning a crystalline semiconductor film to a desired shape. Examples of the semiconductor film include an amorphous semiconductor film a microcrystalline semiconductor film, and a crystalline semiconductor film, and a compound semiconductor film having an amorphous structure such as an amorphous silicon germanium film may be used. In the present embodiment, an amorphous silicon film was formed to have a thickness of 55 nm by plasma CVD, and a solution containing nickel was held on the amorphous silicon film. The amorphous silicon film was dehydrogenated at 500° C. for one hour, and subjected to thermal crystallization at 550° C. for 4 hours. The crystalline silicon film was patterned by photolithography to form semiconductor layers 402 to 406.

In the case of manufacturing a crystalline semiconductor film by laser crystallization, a continuous oscillation type or pulse oscillation type solid-state laser, gas laser, or metal laser can be used. Examples of the solid-state laser include a continuous oscillation type or pulse oscillation type YAG laser, $YVO_4$ laser, YLF laser, $YAlO_3$ laser, glass laser, ruby laser, alexandrite laser, Ti:sapphire laser, and the like. Examples of the gas laser include continuous oscillation type or pulse oscillation type excimer laser, Ar laser, Kr laser, CO, laser, and the like. Examples of the metal laser include helium cadmium laser, copper vapor laser, and gold vapor laser. In the case of using these lasers, a laser beam emitted from a laser oscillator may be condensed into a linear shape by an optical system and radiated to a semiconductor film. The conditions for crystallization are appropriately selected by those skilled in the art. In the case of using a pulse oscillation type excimer laser, a pulse oscillation frequency is set to be 300 Hz, and a laser energy density is set to be 100 to 1200 $mJ/cm^2$ (typically, 200 to 800 $mJ/cm^2$). Furthermore, in the case of using a pulse oscillation type YAG laser, second harmonics are used, and a pulse oscillation frequency is set to be 1 to 300 Hz, and a laser energy density is set to be 300 to 1200 $mJ/cm^2$ (typically, 350 to 1000 $mJ/cm^2$). It may also be possible that laser light condensed into a linear shape with a width of 100 to 1000 µm (e.g., 400 µm) is radiated over the entire surface of a substrate, and an overlap ratio of linear beams is set to be 50 to 98%. Furthermore, an energy density in the case of using a continuous oscillation type laser is required to be about 0.01 to 100 $MW/cm^2$ (preferably 0.1 to 10 $MW/cm^2$). Irradiation is conducted by moving a stage relative to a laser beam at a speed of about 0.5 to 2000 cm/s.

However, in the present embodiment, an amorphous silicon film is crystallized using a metal element accelerating crystallization, so that the metal element remains in a crystalline silicon film. Therefore, an amorphous silicon film with a thickness of 50 to 100 nm is formed on the crystalline silicon film, a heat treatment (thermal annealing using an annealing furnace, RTA, etc.) is conducted to diffuse the metal element into the amorphous silicon film, and the amorphous silicon film is removed by etching after the heat treatment. Because of this, the content of the metal element in the crystalline silicon film can be reduced or removed.

Needless to say, a TFT can also be manufactured by using a crystalline semiconductor film obtained only by conducting laser crystallization. However, if thermal crystallization using a metal element is combined with laser crystallization, crystallinity of a crystalline semiconductor film is enhanced, so that electrical characteristics of a TFT are also enhanced, which is desirable. For example, when a TFT is manufactured by using a crystalline semiconductor film obtained only by conducting laser crystallization, a mobility is about 300 $cm^2$/Vs. On the other hand, when a TFT is manufactured by using a crystalline semiconductor film obtained by thermal crystallization using a metal element and laser crystallization, a mobility is remarkably enhanced (i.e., about 500 to 600 $cm^2$/Vs).

After forming the semiconductor layers 402 to 406, doping of a trace amount of impurity elements (boron or phosphorus) may be conducted so as to control a threshold value of a TFT.

Then a gate insulating film 407 is formed so as to cover the semiconductor layers 402 to 406. The gate insulating film 407 is formed of an insulating film containing silicon so as to have a thickness of 40 to 150 nm by plasma CVD or sputtering. In the present embodiment, a silicon oxynitride film (composition ratio: Si=32%, O=59%, N=7%, H=2%) was formed to have a thickness of 110 nm by plasma CVD. It should be appreciated that the gate insulating film 407 is not limited to a silicon oxynitride film, and may have a single-layered structure or a multi-layered structure of another insulating film containing silicon.

In the case of using a silicon oxide film, the silicon oxide film can be formed by plasma CVD. More specifically, the silicon oxide film can be formed by mixing tetraethyl orthosilicate (TEOS) with $O_2$, setting a reaction pressure and a substrate temperature at 40 Pa and 300° C. to 400° C., and allowing discharge to be conducted at a high-frequency (13.56 MHz) electric density of 0.5 to 0.8 $W/cm^2$. The silicon oxide film thus manufactured exhibits satisfactory electrical characteristics as a gate insulating film by thermal annealing at 400° C. to 500° C.

Then, a first conductive film 408a (thickness: 20 to 100 nm), a second conductive film 408b (thickness: 100 to 800 nm), and a third conductive film 408c (thickness: 20 to 100 nm) are layered on the gate insulating film 407. In the present embodiment, a first conductive film 408a made of a WN film (thickness: 30 nm), a second conductive film 408b made of an Al—Sc film (thickness: 370 nm), and a third conductive film 408c made of a TiN film (thickness: 30) are layered.

In the present embodiment, although the first conductive film 408a is made of WN, there is no particular limit thereto.

As the first conductive film 408a, a conductive layer made of an element selected from W and Mo, or an alloy or compound mainly containing the element, may be formed. Furthermore, although the second conductive film 408b is made of Al—Sc, there is no particular limit thereto. As the second conductive film 408b, a conductive layer made of Al, or an alloy or compound mainly containing Al, may be formed. Furthermore, although the third conductive film 408c is made of TiN, there is no particular limit thereto. As the third conductive film 408c, a conductive layer made of Ti, or an alloy or compound mainly containing Ti, may be formed.

Next, resist masks 410 to 415 are formed by photolithography, whereby a first etching process for forming electrodes and wiring is conducted. The first etching process is conducted under first etching condition and second etching condition (FIG. 8B). In the present embodiment, under the first etching, condition, an ICP etching method is used. More specifically, etching is conducted by generating plasma, using $BCl_3$, $Cl_2$, and $O_2$ as an etching gas in a gas flow rate of 65:10:5 (sccm) with an RF (13.56 MHz) power of 450 W supplied to a coil-shaped electrode under a pressure of 1.2 Pa. An RF (13.56 MHz) power of 300 W is also supplied to a substrate side (sample stage), whereby a substantially negative self-bias voltage is applied thereto. Under the first etching condition, the Al—Sc film and the TiN film are etched to taper the edges of the second and third conductive layers. Furthermore, under the first etching condition, the taper angle of the Al—Sc film and the TiN film becomes about 45°, whereas the WN film is hardly etched.

Thereafter, the etching condition is changed to the second etching condition without removing the resist masks 410 to 415. Under the second etching condition, etching is conducted by generating plasma, using $CF_4$, $Cl_2$, and $O_2$ as an etching gas in a gas flow rate of 25:25:30 (sccm) with an RF (13.56 MHz) power of 500 W supplied to a coil-shaped electrode under a pressure of 1 Pa. An RF (13.56 MHz) power of 20 W is also supplied to a substrate side (sample stage), whereby a substantially negative self-bias voltage is applied thereto. In order to conduct etching without leaving a residue on a gate insulating film, an etching time may be increased by about 10 to 20%.

In the first etching process, by making the shape of a resist mask appropriate, the edges of the first to third conductive layers are tapered due to the effect of a bias voltage applied to the substrate side. The taper angle may be set to be 15° to 45°. Accordingly, first-shaped conductive layers 417 to 422 composed of the first, second, and third conductive layers (first conductive layers 417a to 422a, second conductive layers 417b to 422b, and third conductive layers 417c to 422c) are formed by the first etching process. Reference numeral 416 denotes a gate insulating film. Regions of the gate insulating film 416 not covered with the first-shaped conductive layers 417 to 422 are etched by about 20 to 50 nm to be thin.

Then, a second etching process is conducted without removing the resist masks (FIG. 8C). Herein, etching was conducted by generating plasma, using $BCl_3$ and $Cl_2$ as an etching gas in a gas flow rate of 20:60 (sccm) with an RF (13.56 MHz) power of 600 W supplied to a coil-shaped electrode under a pressure of 1.2 Pa. An RF (13.56 MHz) power of 100 W is also supplied to the substrate side (sample stage), whereby a substantially negative self-bias voltage is applied thereto. In the second etching process, the Al—Sc film and the TiN film are selectively etched. Due to the second etching process, second conductive layers 428b to 433b and third conductive layers 428c to 433c are formed. On the other hand, the first conductive layers 417a to 422a are hardly etched, whereby second-shaped conductive layers 428 to 433 are formed.

As described above, due to the first etching process and the second etching process, gate electrodes 428 to 431, one electrode 432 of a storage capacitor, and a source line 433, using the constitution of the present invention, are formed.

Then, a first doping process is conducted without removing the resist masks, whereby an impurity element imparting n-type is added to the semiconductor layers in a low concentration. The doping process may be conducted by ion doping or ion implantation. Ion doping is conducted under the condition of a dose amount of $1\times10^{13}$ to $5\times10^{14}/cm^2$ and an acceleration voltage of 40 to 80 keV. In the present embodiment, ion doping is conducted under the condition of a dose amount of $1.5\times10^{13}/cm^2$ and an acceleration voltage of 60 keV. As an impurity element imparting n-type, an element belonging to Group 15 (typically, phosphorus (P) or arsenic (As)) is used. Herein, phosphorus (P) is used. In this case, the conductive layers 428 to 433 function as masks with respect to the impurity element imparting n-type, and impurity regions 423 to 427 are formed in a self-alignment manner. An impurity element imparting n-type is added to the impurity regions 423 to 427 so as to have a concentration range of $1\times10^{18}$ to $1\times10^{20}/cm^3$.

After the resist masks are removed, resist masks 434a to 434c are newly formed, and a second doping process is conducted at an acceleration voltage higher than that of the first doping process. Ion doping at this time is conducted under the condition of a dose amount of $1\times10^{13}$ to $1\times10^{15}/cm^2$, and an acceleration voltage of 60 to 120 keV. The doping process is conducted using the second conductive layers 428b to 432b as masks with respect to an impurity element such that the impurity element is added to the semiconductor layers below the taper portions of the first conductive layers. Then, a third doping process is conducted at an acceleration voltage lower than that of the second doping process, whereby a state shown in FIG. 9A is obtained. At this time, ion doping is conducted under the condition of a dose amount of $1\times10^{15}$ to $1\times10^{17}/cm^2$, and an acceleration voltage of 50 to 100 keV. Due to the second and third doping processes, an impurity element imparting n-type is added to low-concentration impurity regions 436, 442, and 448 overlapped with the first conductive layers in a concentration range of $1\times10^{18}$ to $5\times10^{19}/cm$. On the other hand, an impurity element imparting n-type is added to high-concentration impurity regions 435, 441, 444, and 447 in a concentration range of $1\times10^{19}$ to $5\times10^{21}/cm^3$.

Needless to say, by setting an appropriate acceleration voltage, the low-concentration impurity regions and the high-concentration impurity regions can be formed by one doping process, instead of the second and third doping processes.

Then, after removing the resist masks 434a to 434c, resist masks 450a to 450c are newly formed, whereby a fourth doping process is conducted. Because of the fourth doping process, impurity regions 453, 454, 459, and 460, in which an impurity element providing a conductivity opposite to the above-mentioned one conductivity type is added, are formed in the semiconductor layers to be active layers of p-channel TFTs. The second conductive layers 428b to 432b are used as masks with respect to an impurity element, and an impurity element imparting p-type is added, whereby impurity regions are formed in a self-alignment manner. In the present embodiment, the impurity regions 453, 454, 459, and 460 are formed by ion doping using diborane ($B_2H_6$) (FIG. 9B). During the fourth doping process, the semiconductor layers constituting the n-channel TFTs are covered with the resist masks 450a to 450c. Due to the first to third doping processes, phosphorus is added to the impurity region 439. However, doping is conducted in the region so that the concentration of an impurity element imparting p-type becomes $1\times10^{19}$ to $5\times10^{21}$ atmos/cm$^3$, whereby this region functions as a source region or a drain region of a p-channel TFT. Therefore, there is no problem.

Due to the above-mentioned processes, impurity regions are formed in each semiconductor layer.

Then, the resist masks 450a to 450c are removed, and a first interlayer insulating film 461 is formed. The first interlayer insulating film 461 is made of an insulating film containing silicon with a thickness of 100 to 200 nm by plasma CVD or sputtering. In the present embodiment, a silicon oxynitride film with a thickness of 150 nm was formed by plasma CVD. Needless to say, the first interlayer insulating film 461 is not limited to a silicon oxynitride film, and may have a single-layered structure or a multi-layered structure of another insulating film containing silicon.

Then, as shown in FIG. 9C, crystallinity of the semiconductor layers is recovered, and the impurity elements added to the respective semiconductor layers are activated by irradiation with a laser beam. It is desirable to use a continuation oscillation type or pulse oscillation type solid-state laser, gas laser, or metal laser. In particular, laser annealing process using a YAG laser is preferably conducted. If a continuous oscillation type laser is used, an energy density of laser light is required to be about 0.01 to 100 MW/cm$^2$ (preferably, 0.01 to 10 MW/cm$^2$), and a substrate is moved relative to laser light at a speed of 0.5 to 2000 cm/s. If a pulse oscillation type laser is used, it is desirable that a frequency is set to be 300 Hz, and a laser energy density is set to be 50 to 900 mJ/cm$^2$ (typically, 50 to 500 mJ/cm$^2$). At this time, laser light may be overlapped by 50 to 98%. In the case where regions of the second conductive layers contacting the first interlayer insulating film 461 are sufficiently oxidized, and projections such as hillock and whisker are not formed even by a heat treatment, thermal annealing using an annealing furnace or RTA can be applied.

A heat treatment may be conducted before forming the first interlayer insulating film. In the case where wiring to be used is weak to heat it is preferable that an activation process is conducted after the interlayer insulating film (insulating film mainly containing silicon, e.g., silicon nitride film) is formed so as to protect wiring and the like as in the present embodiment.

Then, hydrogenation can be conducted by a heat treatment (300° C. to 450° C. for 1 to 12 hours). In this process, dangling bonds of the semiconductor layers are terminated due to hydrogen contained in the first interlayer insulating film 461. Irrespective of the presence of the first interlayer insulating film, the semiconductor layers can be hydrogenated. As an alternative method of hydrogenation, plasma hydrogenation (using hydrogen excited by plasma) or a heat treatment at 300° C. to 450° C. for 1 to 12 hours in an atmosphere containing 3 to 100% hydrogen may be conducted.

Figure 21:
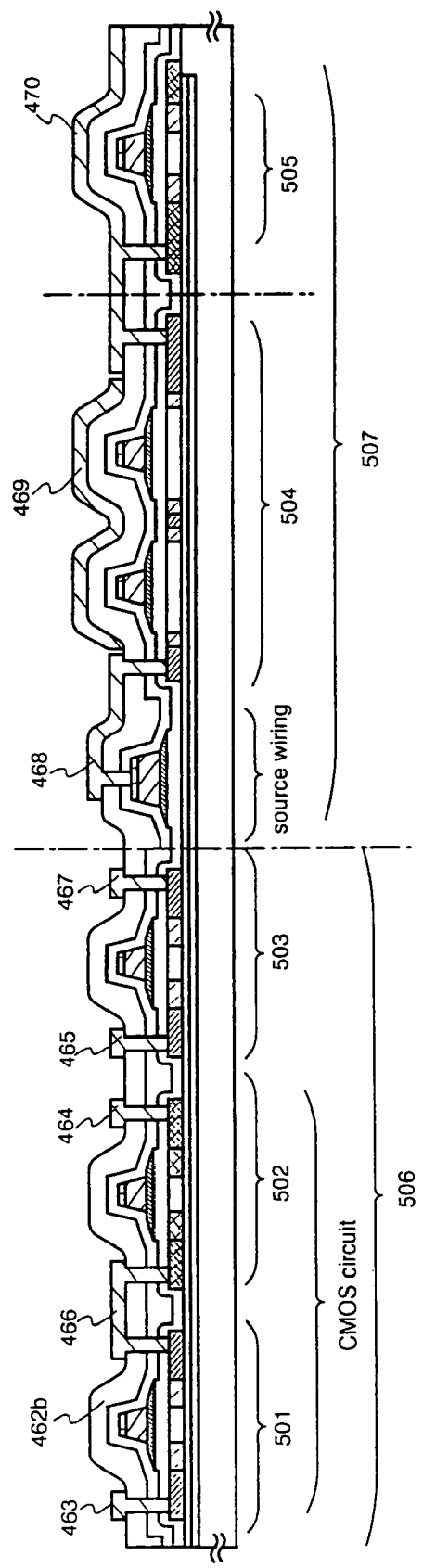
FIG. 21 is a cross-sectional view illustrating processes of manufacturing a pixel TFT and a TFT of a driving circuit.

Next, a second interlayer insulating film 462a made of an inorganic insulating film material or an organic insulating material is formed on the first interlayer insulating film 461. In the present embodiment, an acrylic resin film is formed, which has a thickness of 1.6 μm and a viscosity of 10 to 1000 cp (preferably, 40 to 200 cp), and in which unevenness is formed on the surface. In the case where an organic resin film is not used, the second interlayer insulating film 462b with a shape as shown in FIG. 21 is formed.

In the present embodiment, in order to prevent mirror reflection, the second interlayer insulating film, on which unevenness is provided, is formed, whereby unevenness is formed on the surface of pixel electrodes. Furthermore, in order to obtain light scattering by forming unevenness on the surface of pixel electrodes, convex portions may be formed in lower regions of the pixel electrodes. In this case, the convex portions can be formed by using the same photomask as that for forming a TFT. Therefore, the number of processes is not required to be increased. The convex portions may be appropriately provided on the substrate in the pixel portion other than wiring and a TFT portion. Because of this, unevenness is formed on the surface of pixel electrodes along the unevenness formed on the surface of the insulating film covering the convex portions.

As the second interlayer insulating film 462a, a film whose surface is to be flattened may be used. In this case, it is preferable that after pixel electrodes are formed, the surface is provided with unevenness by conducting known sand blast, etching, and the like to prevent mirror reflection and allow reflected light to scatter, thereby enhancing whiteness.

Figure 10:
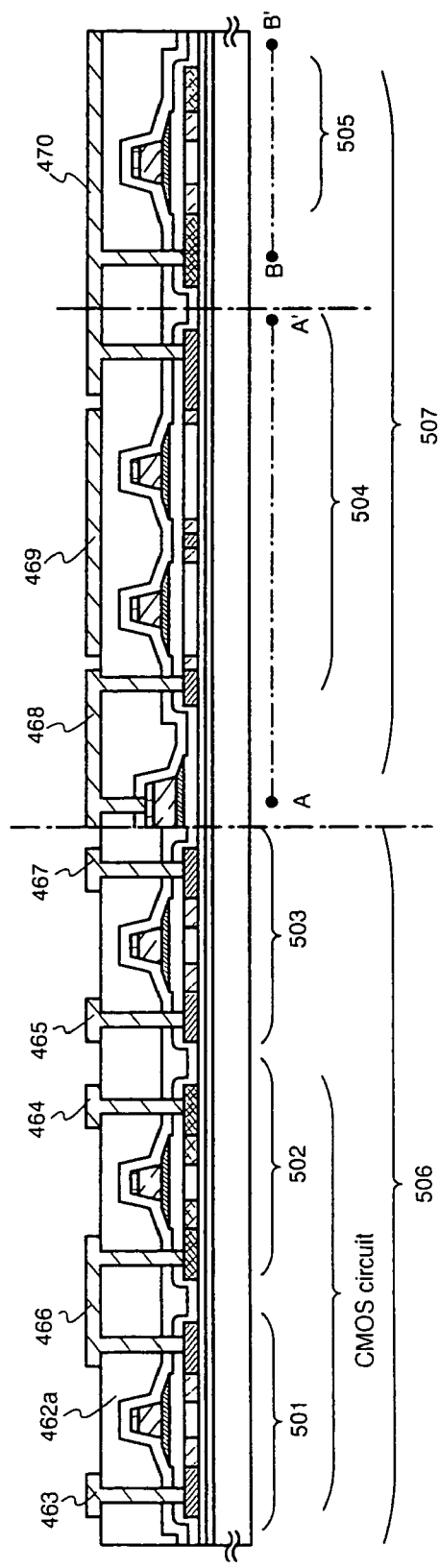
FIG. 10 is a cross-sectional view showing processes of manufacturing a pixel TFT and a TFT of a driving circuit.

In a driving circuit 506, wires 463 to 467 electrically connected to the respective impurity regions are formed. These wires are formed by patterning a layered film of a Ti film (thickness: 50 nm) and an alloy (Al and Ti) film (thickness: 500 nm). It is appreciated that the wires may have a single-layered structure or a multi-layered structure of three or more layers, instead of a double-layered structure. Furthermore, a material for wiring is not limited to Al and Ti. For example, a layered film obtained by forming Al or Cu on a TaN film and forming a Ti film thereon may be patterned to form wiring (FIG. 10).

In a pixel portion 507, a pixel electrode 470, a gate line 469, and a connection electrode 468 are formed. The connection electrode 468 allows a source line (433a to 433c) to be electrically connected to a pixel TFT. Furthermore, the gate line 469 is electrically connected to a gate electrode of a pixel TFT. Furthermore, the pixel electrode 470 is electrically connected to a drain region 442 of a pixel TFT, and electrically connected to the semiconductor layer 458 that functions as one electrode constituting a storage capacitor. As the pixel electrode 470, a material excellent in reflectivity such as a film mainly containing Al or Ag, or a layered film thereof is desirably used.

As described above, the driving circuit 506 having a CMOS circuit composed of an n-channel TFT 501 and a p-channel TFT 502 and an n-channel TFT 503, and the pixel portion 507 having a pixel TFT 504 and a storage capacitor 505 comprising a capacitor wiring 523 can be formed on the same substrate. Thus, an active matrix substrate is completed.

The n-channel TFT 501 of the driving circuit 506 has the channel formation region 437, the low-concentration impurity regions 436 (GOLD regions) overlapped with the first conductive layer 428a constituting a part of a gate electrode, and the high-concentration impurity regions 452 that function as a source region or a drain region. The p-channel TFT 502 constituting a CMOS circuit by being connected to the n-channel TFT 501 through the electrode 466 has the channel formation region 440, the high-concentration impurity regions 454 that function as a source region or a drain region, and the impurity regions 453 in which an impurity element imparting n-type and an impurity element imparting p-type are introduced. Furthermore, the n-channel TFT 503 has the channel-formation region 443, the low-concentration impurity regions 442 (GOLD regions) overlapped with the first conductive layer 430a constituting a part of a gate electrode, and the high-concentration impurity regions 456 that function as a source region or a drain region.

The pixel TFT 504 of the pixel portion 507 has the channel-formation regions 446, the low-concentration impurity regions 445 (lightly doped drain (LDD) regions) formed outside of a gate electrode, and the high-concentration impurity regions 458 that function as a source region or a drain region. Furthermore, an impurity element imparting n-type and an impurity element imparting p-type are added to the semiconductor layer that functions as one electrode of the storage capacitor 505. The storage capacitor 505 is composed of an electrode (layered structure 432a to 432c) and the semiconductor layer using the insulating film 416 as a dielectric.

In the pixel configuration of the present embodiment, the edges of the pixel electrode are disposed so as to be overlapped with a source line such that a gap between pixel electrodes is light-shielded without using a black matrix.

Figure 11:
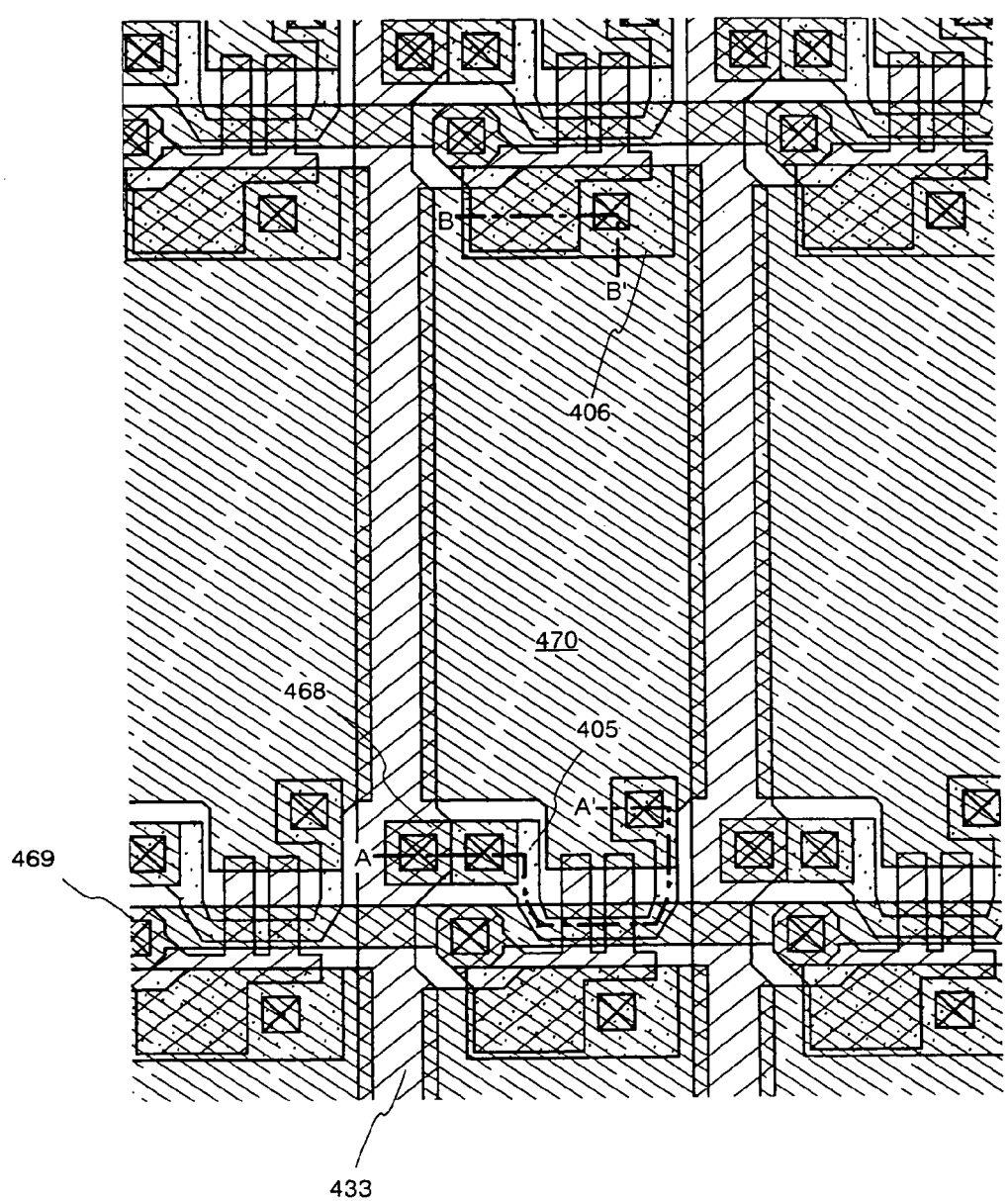
FIG. 11 is a top view showing a configuration of a pixel TFT.

Furthermore, FIG. 11 shows a top view of a pixel portion of an active matrix substrate manufactured in the present embodiment. Corresponding portions in FIGS. 8A-8C to 11 are denoted with the same reference numerals. A broken line A-A' in FIG. 10 corresponds to a cross-section taken along a broken line A-A' in FIG. 11. A broken line B-B' in FIG. 10 corresponds to a cross-section taken along a broken line B-B' in FIG. 11.

In the wiring thus produced, low resistance is realized, and a wiring board having the wiring is fully designed for an enlarged pixel portion.

The present embodiment can be arbitrarily combined with any one of Embodiments 1 to 4.

Embodiment 6

Figure 12:
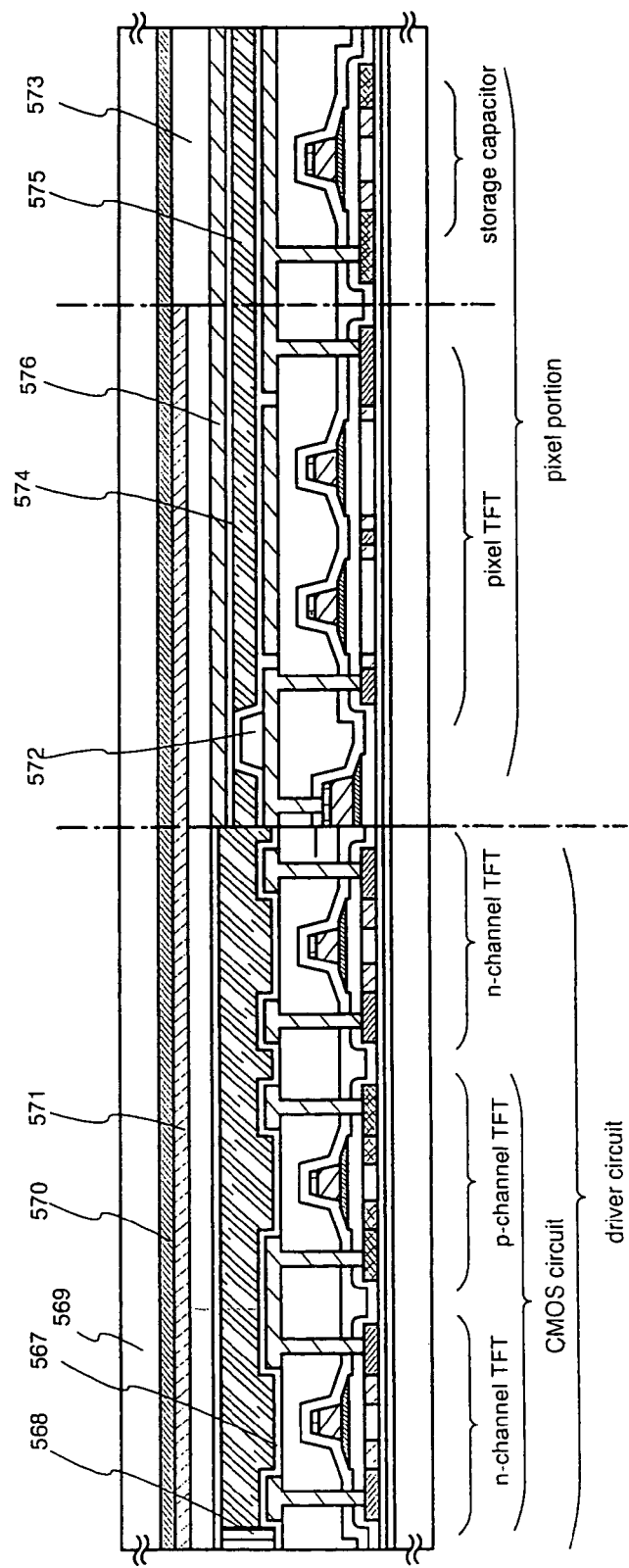
FIG. 12 is a cross-sectional view illustrating processes of manufacturing an active matrix type liquid crystal display device.

In the present embodiment, the processes of manufacturing a reflection type liquid crystal display device using the active matrix substrate manufactured in Embodiment 5 will be described with reference to FIG. 12.

First, in accordance with Embodiment 5, the active matrix substrate as shown in FIG. 10 is obtained. Thereafter, an alignment film 567 is formed at least on a pixel electrode 470 on the active matrix substrate in FIG. 10, and a rubbing treatment is conducted. In the present embodiment, before forming the alignment film 567, an organic resin film such as an acrylic resin film was patterned, whereby a column-shaped spacer 572 for holding a substrate gap was formed at a desired position. Furthermore, spherical spacers may be scattered over the entire surface of the substrate, in place of column-shaped spacers.

Then, a counter substrate 569 is prepared. Coloring layers 570 and 571, and a leveling film 573 are formed on the counter substrate 569. The red coloring layer 570 is overlapped with the blue coloring layer 571 to form a light-shielding portion. It may also be possible that a red coloring layer is partially overlapped with a green coloring layer to form a light-shielding portion.

In the present embodiment, the substrate described in Embodiment 5 is used. Therefore, in FIG. 11 showing a top view of the pixel portion in Embodiment 5, it is required that at least the gap between the gate line 469 and the pixel electrode 470, the gap between the gate line 469 and the connection electrode 468, and the gap between the connection electrode 468 and the pixel electrode 470 should be light-shielded. In the present embodiment, each coloring layer was disposed so that a light-shielding portion composed of a stack of coloring layers was overlapped with positions to be light-shielded, under which condition the counter substrate was attached.

As described above, the gap between the respective pixels is light-shielded with a light-shielding portion composed of a stack of coloring layers, whereby the number of processes can be reduced, without forming a light-shielding layer such as a black mask.

Then, a counter electrode 576 composed of a transparent conductive film is formed on the leveling film 573 at least in the pixel portion, and an alignment film 574 is formed over the entire surface of the counter substrate, whereby a rubbing treatment was conducted.

Then, the active matrix substrate on which the pixel portion and the driving circuit are formed and the counter substrate are attached to each other with a sealant 568. A filler is mixed in the sealant 568, and two substrates are attached to each other at a uniform interval with the filler and column spacers. Thereafter, a liquid crystal material 575 is injected between the substrates, and the substrates are completely sealed with a sealant (not shown). A known liquid crystal material may be used for the liquid crystal material 575. Thus, a reflection type liquid crystal display device shown in FIG. 12 is completed. If required, the active matrix substrate or the counter substrate is separated in a desired shape. Furthermore, a polarizing plate (not shown) was attached to only the counter substrate. Then, a flexible printed circuit (FPC) was attached by a known technique.

A liquid crystal display panel manufactured as described above can be used as a display portion of various electronic equipment. The liquid crystal display panel is fully designed for a large area without decreasing an aperture ratio in the pixel portion.

The present embodiment can be arbitrarily combined with any one of embodiments 1 to 5.

Embodiment 7

Figure 13:
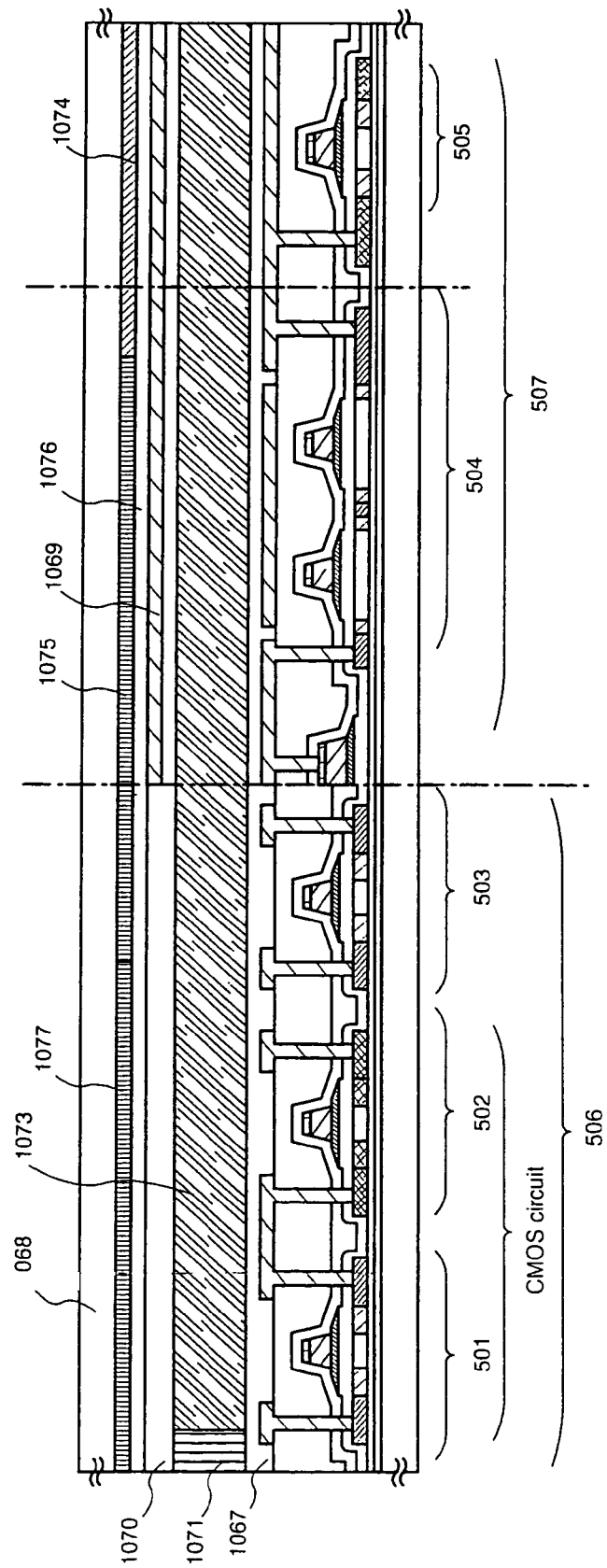
FIG. 13 is a cross-sectional view illustrating processes of manufacturing an active matrix type liquid crystal display device.

In the present embodiment, the processes of manufacturing an active matrix type liquid crystal display device different from that of Embodiment 6 using the active matrix substrate manufactured in Embodiment 5 will be described with reference to FIG. 13.

First, in accordance with Embodiment 5, the active matrix substrate as shown in FIGS. 8A-8C is obtained. Thereafter, an alignment film 1067 is formed on the active matrix substrate in FIGS. 8A-8C, and a rubbing treatment is conducted. In the present embodiment, before forming the alignment film 1067, an organic resin film such as an acrylic resin film was patterned, whereby a column-shaped spacer 572 for holding a substrate gap was formed at a desired position. Furthermore, spherical spacers may be scattered over the entire surface of the substrate, in place of column-shaped spacers.

Then, a counter substrate 1068 is prepared. The counter substrate is provided with a color filter in which a coloring layer 1074 and a light-shielding layer 1075 are disposed so as to correspond to each pixel. A light-shielding layer 1077 was formed even in a portion of a driving circuit. A leveling film 1076 covering the color filter and the light-shielding layer 1077 was provided. Then, a counter electrode 1069 made of a transparent conductive film on the leveling film 1076 was formed in the pixel portion, and an alignment film 1070 was formed over the entire surface of the counter substrate 1068, followed by conducting a rubbing treatment.

Then, the active matrix substrate on which the pixel portion and the driving circuit are formed and the counter substrate are attached to each other with a sealant 1071. A filler is mixed in the sealant 1071, and two substrates are attached to each other at a uniform interval with the filler and column spacers. Thereafter, a liquid crystal material 1073 is injected between the substrates, and the substrates are completely sealed with a sealant (not shown). A known liquid crystal material may be used for the liquid crystal material 1073. Thus, an active matrix type liquid crystal display device shown in FIG. 11 is completed. If required, the active matrix substrate or the counter substrate is separated in a desired shape. Furthermore, a polarizing plate or the like was appropriately provided by using a known technique. Then, an FPC was attached by a known technique.

A liquid crystal display panel manufactured as described above can be used as a display portion of various electronic equipment. The liquid crystal display panel is fully designed for a large area without decreasing an aperture ratio in the pixel portion.

The present embodiment can be arbitrarily combined with any one of embodiments 1 to 5.

Embodiment 8

In the present embodiment, as an embodiment of a wiring board utilizing the present invention, exemplary production of a light-emitting device will be described using a method of manufacturing a TFT for manufacturing the active matrix substrate described in Embodiment 5. In the present specification, a light-emitting device collectively refers to a display panel in which a light-emitting element formed on a substrate is sealed between the substrate and a cover member and a display module in which an IC is mounted on the display panel. A light-emitting element includes a light-emitting layer containing an organic compound that allows electroluminescence generated by application of an electric field to be obtained, an anode layer, and a cathode layer. Furthermore, luminescence in an organic compound includes fluorescence obtained when a singlet excited state returns to a normal state and phosphorescence obtained when a triplet excited state returns to a normal state. Either one of or both of emission light is included.

In the present specification, all the layers formed between an anode and a cathode in a light-emitting element are defined as organic light-emitting layers. Specifically, the organic light-emitting layers include a light-emitting layer, a hole injection layer, an electron injection layer, a hole transport layer, an electron transport layer, etc. A light-emitting element has a basic structure in which an anode layer, a light-emitting layer, and a cathode layer are successively stacked. In addition to the above-mentioned structure, the light-emitting element may have a structure in which an anode layer, a hole injection layer, a light-emitting layer, and a cathode layer are successively stacked, a structure in which an anode layer, a hole injection layer, a light-emitting layer, an electron transport layer, and a cathode layer are successively stacked, etc.

Figure 14:
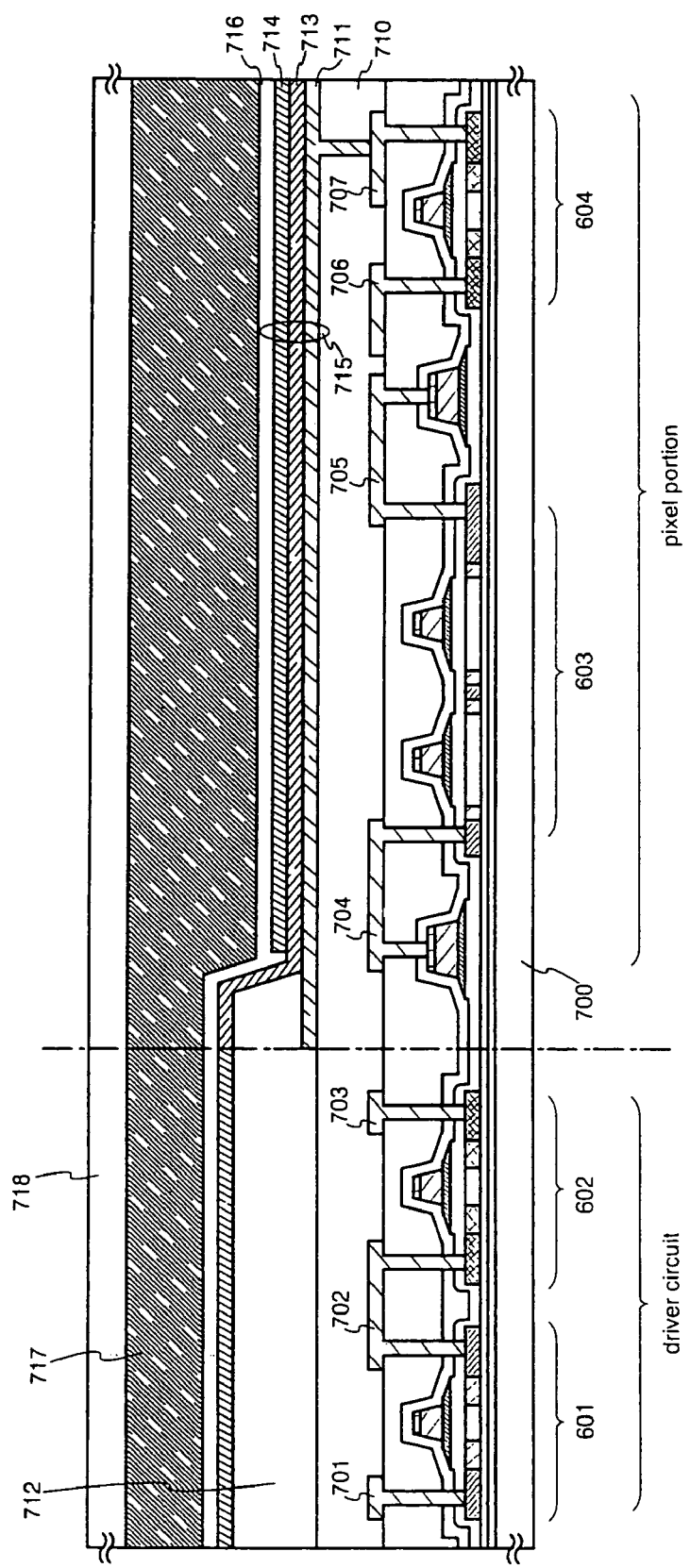
FIG. 14 is a cross-sectional structural view of a driving circuit and a pixel portion of a light-emitting device.

FIG. 14 is a cross-sectional view of a light-emitting device of the present embodiment. In FIG. 14, a switching TFT 603 provided on a substrate 700 is formed by using the n-channel TFT 503 in FIG. 10. Regarding the configuration of the switching TFT 603, the description of the n-channel TFT 503 may be referred to.

Although the present embodiment shows a double-gate structure in which two channel-formation regions are formed, a single-gate structure in which one channel-formation region is formed or a triple-gate structure in which three channel-formation regions are formed may be used.

A driving circuit provided on the substrate 700 is formed by using the CMOS circuit shown in FIG. 10. Therefore, regarding the description of the configuration of the driving circuit, the description of the n-channel TFT 501 and the p-channel TFT 502 may be referred to. Although the present embodiment shows a single-gate structure, a double-gate structure or a triple-gate structure may be used.

Furthermore, wires 701 and 703 function as source lines of a CMOS circuit, and a wire 702 functions as a drain line. A wire 704 functions as a wire for electrically connecting a source line 708 to a source region of a switching TFT, and a wire 705 functions as a wire for electrically connecting a drain line 709 to a drain region of a switching TFT.

A current control TFT 604 is formed by using the p-channel TFT 502 in FIG. 10. Therefore, regarding the description of the current control TFT 604, the description of the p-channel TFT 502 may be referred to. Although the present embodiment shows a single-gate structure, a double-gate substrate or a triple-gate structure may be used.

A wire 706 is a source line (corresponding to a current supply line) of the current control TFT 604, and reference numeral 707 denotes an electrode that is electrically connected to a pixel electrode 711 by being overlapped with the pixel electrode 711 of the current control TFT.

The pixel electrode 711 is an anode of a light-emitting element, made of a transparent conductive film. As the transparent conductive film, a compound of indium oxide and tin oxide, a compound of indium oxide and zinc oxide, zinc oxide, tin oxide, or indium oxide can be used. The transparent conductive film with gallium added thereto may be used. The pixel electrode 711 is formed on a flat interlayer insulating film 710 before forming the above-mentioned wiring. In the present embodiment, it is very important to flatten the step difference caused by TFTs by using a leveling film 710 made of a resin. A light-emitting layer to be formed later is very thin, so that light-emission defects may be caused due to the presence of the step difference. Therefore, it is desirable that the surface is flattened before forming pixel electrodes so that the light-emitting layer can be formed on a flat surface.

After the wires 701 to 707 are formed, a bank 712 is formed as shown in FIG. 14. The bank 712 may be formed by patterning an insulating film or an organic resin film (thickness: 100 to 400 nm) containing silicon.

Since the bank 712 is made of an insulating film, care should be taken to electrostatic breakdown of element during film formation. In the present embodiment, a resistance is decreased by adding carbon particles or metal particles to an insulating film to be a material for the bank 712 whereby static electricity is suppressed. At this time, the adding amount of carbon particles or metal particles may be regulated so that a resistance becomes $1\times10^6$ to $1\times10^{12}$ Ωm (preferably $1\times10^8$ to $1\times10^{10}$ Ωm).

A light-emitting layer 713 is formed on the pixel electrode 711. Although one pixel is shown in FIG. 14, light-emitting layers are formed so as to correspond to R(red), G(green), and B(blue) in the present embodiment. Furthermore, in the present embodiment, a low molecular-weight organic light-emitting material is formed by vapor deposition. More specifically, a layered structure is used in which copper phthalocyanine (CuPc) film (thickness: 20 nm) is provided as a hole injection layer, and a tris-8-quinolinolatoaluminum complex ($Alq_3$) film (thickness: 70 nm) is provided as a light-emitting layer on the hole injection layer. By adding fluorochrome such as quinacridon, perylene, or DCM1 to $Alq_3$, a light-emission color can be controlled.

It should be noted that an exemplary organic light-emitting material which can be used as a light-emitting layer has been described in the above, but the present embodiment is not limited thereto. A light-emitting layer (for emitting light and moving carriers for light emission) may be formed by arbitrarily combining a light-emitting layer, a charge transport layer, or a charge injection layer. In the present embodiment, a low molecular-weight organic light-emitting material is used as a light-emitting layer; however, an intermediate molecular-weight organic light-emitting material or a high molecular-weight organic light-emitting material may be used. In the present specification, an intermediate molecular-weight organic light-emitting material refers to an organic light-emitting material having no sublimation property and containing 20 or less molecules or having a length of linked molecules of 10 μm or less. Furthermore, as an example using a high molecular-weight organic light-emitting material, a layered structure may be used in which a polythiophene (PE-DOT) film (thickness: 20 nm) is provided as a hole injection layer by spin coating, and a paraphenylene vinylene (PPV) film (thickness: about 100 nm) is provided on the hole injection layer as a light-emitting layer. When π-conjugated type polymer of PPV is used, a light-emission wavelength from red to blue can be selected. Furthermore, it is also possible to use an inorganic material such as silicon carbide as a charge transfer layer or a charge injection layer. As the organic light-emitting material and inorganic material, known materials can be used.

Next, a cathode 714 made of a conductive film is provided on the light-emitting layer 713. In the present embodiment, an alloy film of aluminum and lithium is used as a conductive film. Needless to say, a known MgAg film (alloy film of magnesium and silver) may be used. As a material for a cathode, a conductive film made of an element belonging to Group 1 or Group 2 of the periodic table, or a conductive film with these elements added thereto may be used.

When the cathode 714 is formed, a light-emitting element 715 is completed. The light-emitting element 715 herein refers to a diode formed of the pixel electrode (anode) 711, the light-emitting layer 713, and the cathode 714.

It is effective that a passivation film 716 is provided so as to completely cover the light-emitting element 715. As the passivation film 716, a single-layered structure or a multi-layered structure of an insulating film including a carbon film, a silicon nitride film, or a silicon oxynitride film is used.

In this case, a film with satisfactory coverage is preferably used as the passivation film. It is effective to use a carbon film (particularly, DLC film). Since the DLC film can be formed in a temperature range from room temperature to 100° C., the DLC film can be easily formed even above the light-emitting layer 713 with low heat resistance. Furthermore, due to a high blocking effect with respect to oxygen, the DLC film can suppress oxidation of the light-emitting layer 713. Therefore, the light-emitting layer 713 can be prevented from being oxidized while the subsequent sealing process is conducted.

Furthermore, a sealant 717 is provided on the passivation film 716, and a cover member 718 is attached to the sealant 717. As the sealant 717, a UV-curable resin may be used, and it is effective to provide a material having moisture absorbency or a material having an antioxidant effect in the sealant 717. Furthermore, in the present embodiment, as the cover member 718, a glass substrate, a quartz substrate, or a plastic substrate (including a plastic film) with a carbon film (preferably, a DLC film) formed on both sides thereof is used.

Accordingly, a light-emitting device having a configuration as shown in FIG. 14 is completed. It is effective that the process, in which the passivation film 716 is formed after the bank 712 is formed, is continuously conducted without being exposed to the atmosphere in a film-formation apparatus of a multi-chamber type (or an in-line type). It is also possible that the process up to the attachment of the cover member 718 is conducted continuously without being exposed to the atmosphere.

Accordingly, n-channel TFTs 601 and 602, a switching TFT (n-channel TFT) 603, and a current control TFT (n-channel TFT) 604 are formed on the substrate 700.

Furthermore, as described with reference to FIG. 14, by providing impurity regions overlapped with a gate electrode via an insulating film, an n-channel TFT that is unlikely to be degraded due to a hot-carrier effect can be formed. Therefore, a highly reliable light-emitting device can be realized.

In the present embodiment, only the configurations of a pixel portion and a driving circuit are shown. However, in accordance with the manufacturing processes of the present embodiment, logic circuits such as a signal division circuit, a D/A converter, an operational amplifier, and a γ-correction circuit can be formed on the same insulator. Furthermore, even a memory and a microprocessor can be formed.

The light-emitting device of the present embodiment after the sealing (or encapsulation) process for protecting a light-emitting element is conducted will be described with reference to FIGS. 15A and 15B. If required, reference numerals used in FIG. 14 will be cited.

Figure 15A:
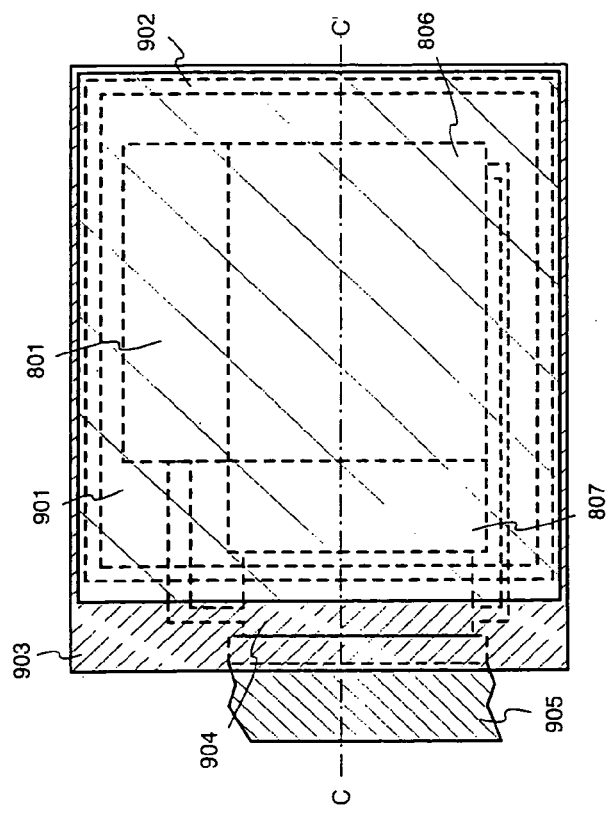
FIG. 15A is a top view of a light-emitting device.
Figure 15B:
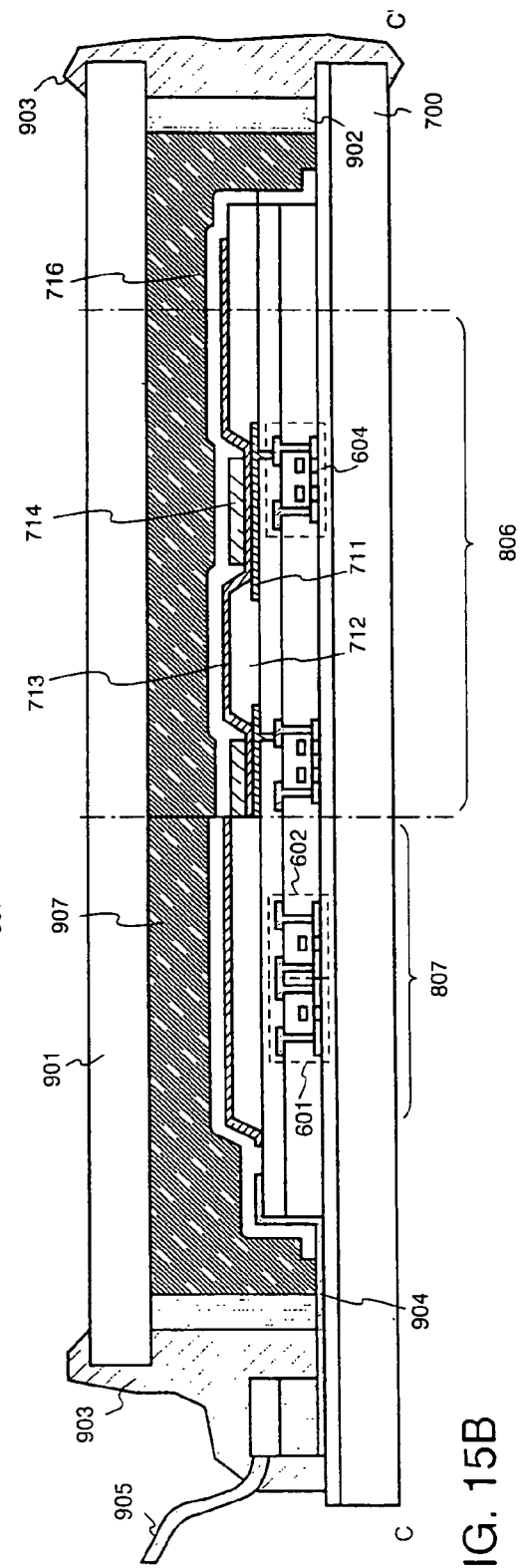
FIG. 15B is a cross-sectional structural view of a driving circuit and a pixel portion of the light-emitting device.

FIG. 15A is a top view showing a state in which sealing of a light-emitting element is completed. FIG. 15B is a cross-sectional view taken along a line C-C' in FIG. 15A. Portions surrounded by dotted lines and denoted with reference numerals 801, 806, and 807 are a source-side driving circuit, a pixel portion, and a gate-side driving circuit, respectively. Reference numeral 901 denotes a cover member, 902 denotes a first sealant, 903 denotes a second sealant, and a sealing material 907 is provided in an inner portion surrounded by the sealant 902.

Reference numeral 904 denotes wiring for transmitting a signal input to the source-side driving circuit 801 and the gate-side driving circuit 807 and receiving a video signal and a clock signal from a flexible printed circuit (FPC) 905 to be an external input terminal. Herein, although only an FPC is shown, a printed wiring board (PWB) may be attached to the FPC. The light-emitting device in the present specification includes not only a light-emitting device itself but also a light-emitting device with an FPC or a PWB.

Next, a cross-sectional configuration will be described with reference to FIG. 15B. The pixel portion 806 and the gate-side driving circuit 807 are formed above the substrate 700. The pixel portion 806 is composed of a current control TFT 604 and a plurality of pixels including a pixel electrode 710 electrically connected to a drain of the current control TFT 604. Furthermore, the gate-side driving circuit 807 is composed of a CMOS circuit (see FIG. 14) obtained by combining the n-channel TFT 601 with the p-channel TFT 602.

The pixel electrode 711 functions as an anode of a light-emitting element. Banks 712 are formed at both ends of the pixel electrode 711, and a light-emitting layer 713 and a cathode 714 of a light-emitting element are formed on the pixel electrode 711.

The cathode 714 functions as wiring common to all the pixels, and is electrically connected to the FPC 905 via the connection line 904. Furthermore, all the elements contained in the pixel portion 806 and the gate-side driving circuit 807 are covered with the cathode 714 and the passivation film 716.

The cover member 901 is attached with the first sealant 902. Spacers made of a resin film may be provided so as to ensure a gap between the cover member 901 and the light-emitting element. An inner portion of the first sealant 902 is filled with the sealing material 907. An epoxy resin is preferably used for the first sealant 902 and the sealing material 907. It is desirable that the first sealant 902 is unlikely to transmit moisture and oxygen. Furthermore, the sealing material 907 may contain a material having moisture absorbency and an antioxidant effect.

The sealing material 907 provided so as to cover the light-emitting element also functions as an adhesive for attaching the cover member 901. In the present embodiment, as a material for a plastic substrate 901a constituting the cover member 901, fiberglass-reinforced plastics (FRP), polyvinyl fluoride (PVF), Mylar, polyester, or acrylic resin can be used.

Furthermore, after the cover member 901 is attached with the sealing material 907, a second sealant 903 is provided so as to cover the side surfaces (exposed surfaces) of the sealing material 907. The second sealant 903 can be made of the same material as that for the first sealant 902.

By sealing the light-emitting element with the sealing material 907 in the above-mentioned configuration, the light-emitting element can be completely shut off from the outside, whereby a material accelerating degradation of the light-emitting layer due to oxidation, such as moisture and oxygen, can be prevented from entering from the outside. Thus, a highly reliable light-emitting device is obtained. Furthermore, the light-emitting device can be fully designed for a large area without decreasing an aperture ratio in the pixel portion.

The present embodiment can be arbitrarily combined with any one of Embodiments 1 to 5.

Embodiment 9

In the present embodiment, a light-emitting device having a pixel configuration different from that in Embodiment 8 will be described with reference to FIG. 16.

Figure 16:
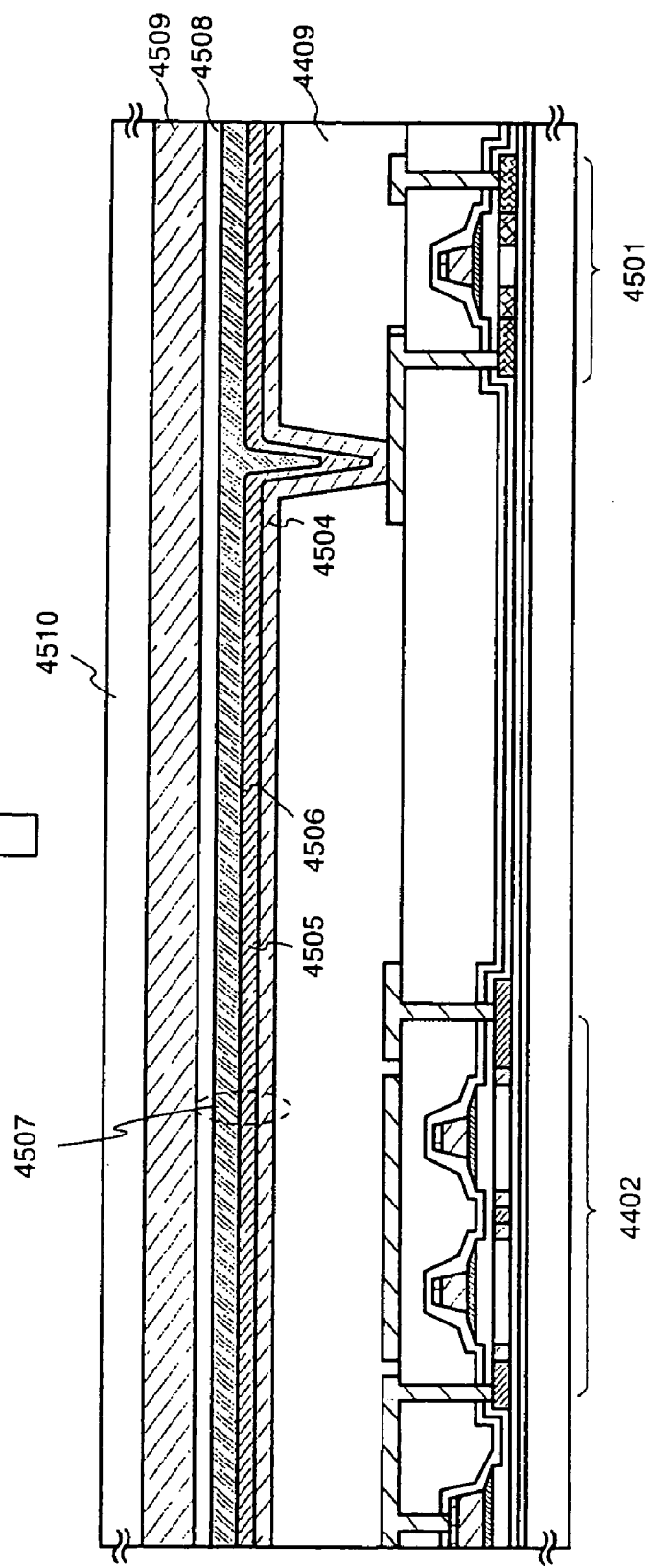
FIG. 16 is a cross-sectional structural view of a driving circuit and a pixel portion of a light-emitting device.

In FIG. 16, as a current control TFT 4501, a TFT having the same configuration as that of the p-channel TFT 502 in FIG. 10 is used, and as a switching TFT 4402, a TFT having the same configuration as that of the pixel TFT 504 in FIG. 10 is used. Needless to say, a gate electrode of the current control TFT 4501 is electrically connected to a drain line of the switching TFT 4402. Furthermore, a drain line of the current control TFT 4501 is electrically connected to a pixel electrode 4504 formed on an insulating film 4409.

In the present embodiment, the pixel electrode 4504 made of a conductive film functions as a cathode of a light-emitting element. More specifically, an alloy film of aluminum and lithium is used. A conductive film made of an element belonging to Group 1 or Group 2 in the periodic table or a conductive film with the element added thereto may be used.

A light-emitting layer 4505 is formed on the pixel electrode 4504. Only one pixel is shown in FIG. 16, and in the present embodiment, a light-emitting layer corresponding to G (green) is formed by vapor deposition and coating (preferably, spin coating). More specifically, the light-emitting layer has a multi-layered structure in which a lithium fluoride (LiF) film (thickness: 20 nm) is provided as an electron injection layer, and a polyparaphenylene vinylene (PPV) film (thickness: 70 nm) is provided thereon as a light-emitting layer.

An anode 4506 made of a transparent conductive film is provided on the light-emitting layer 4505. In the present embodiment, as the transparent conductive film, a conductive film made of a compound of indium oxide and tin oxide or a compound of indium oxide and zinc oxide is used.

When the anode 4506 is formed, a light-emitting element 4507 is completed. The light-emitting element 4507 herein refers to a diode formed of the pixel electrode (cathode) 4504, the light-emitting layer 4505, and the anode 4506.

It is effective to provide a passivation film 4508 so as to completely cover the light-emitting element 4507. As the passivation film 4508, a single-layered structure or a multi-layered structure of an insulating film including a carbon film, a silicon nitride film, or a silicon oxynitride film is used.

Furthermore, a sealing material 4509 is provided on the passivation film 4508, and a cover member 4510 is attached to the sealing material 4509. As the sealing material 4509, UV-curable resin may be used, and it is effective to provide a material having moisture absorbency or an antioxidant effect in the sealing material 4509. In the present embodiment, as the cover member 4510, a glass substrate, a quartz substrate, or a plastic substrate (including a plastic film) with a carbon film (preferably, a DLC film) formed on both sides thereof is used.

In the wiring of the light-emitting device thus manufactured, low resistance is realized, and such a light-emitting device is fully designed for a large area without decreasing an aperture ratio in the pixel portion.

The present embodiment can be arbitrarily combined with any one of Embodiments 1 to 5.

Embodiment 10

In the present embodiment, an exemplary liquid crystal display device according to the present invention will be described in which a TFT configuration is different from that of the active matrix substrate manufactured in Embodiment 5.

On an active matrix substrate shown in FIG. 18A, a driving circuit 506 having an n-channel TFT 503 and a p-channel TFT 502, and a pixel portion 507 having a pixel TFT 504 and a storage capacitor 505 are formed.

These TFTs are obtained by forming gate lines 512 to 517 on a substrate 510, forming an insulating film 511 (511a and 511b) on the gate lines 512 to 517 (512a to 517a, 512b to 517b, and 512c to 517c), and providing channel-formation regions, source regions, drain regions, LDD regions, and the like in a semiconductor layer on the insulating film. The semiconductor layer is formed according to the present invention in the same way as in Embodiments 1 to 5.

The gate lines 512 to 517 are formed to have a thickness of 200 to 400 nm (preferably, 250 nm) such that the edges of the gate lines 512 to 517 are tapered so as to enhance step coverage of a coating film to be formed on upper layers thereof. The gate lines 512 to 517 are formed such that the taper angle becomes 5° to 30° (preferably, 15° to 25°). The taper portions are formed by dry etching, and the angle thereof is controlled with an etching gas and a bias voltage applied to the substrate side.

Furthermore, impurity regions are formed in first to third doping processes. First, the first doping process is conducted, whereby an LDD region of an n-channel TFT is formed. Doping may be conducted by ion doping or ion implantation. Phosphorus (P) is added as an impurity element imparting n-type (doner), and first impurity regions are formed with a mask. Then, a mask is newly formed so as to cover the LDD region of the n-channel TFT, whereby a source region and a drain region of the n-channel TFT are formed during the second doping process.

In the third doping process, a source region and a drain region of a p-channel TFT are formed. Doping is conducted only by adding an impurity element imparting p-type (acceptor) by ion doping or ion implantation. At this time, the semiconductor layer in which an n-channel TFT is to be formed is covered with a mask, so that the impurity element imparting p-type will not be added to the semiconductor layer. In the present embodiment, although an LDD region is not manufactured in the p-channel TFT, the LDD region may be provided.

Thus, in the n-channel TFT 503, LDD regions 530 and a source region or a drain region 531 are formed outside of a channel-formation region 529. A p-channel TFT 502 also has the same configuration and is composed of a channel-formation region 527, and a source region or a drain region 528. In the present embodiment, a single-gate structure is used; however, a double-gate structure or a triple-gate structure may be used.

In the pixel portion 507, the pixel TFT 504 formed of an n-channel TFT has a multi-gate structure for the purpose of reducing an OFF-current, and an LDD region 533, and a source region or a drain region 534-536 are provided outside of a channel-formation region 532.

An interlayer insulating film is composed of a first interlayer insulating film 540 (thickness: 50 to 500 nm) made of an inorganic material such as silicon oxide, silicon nitride, or silicon oxynitride, and a second interlayer insulating film 541 made of an organic insulating material such as polyimide, acrylic resin, polyimideamide, and benzocyclobutene (BCB). Thus, by forming the second interlayer insulating film of an organic insulating material, the surface of the interlayer insulating film can be satisfactorily flattened. An organic resin material generally has a low dielectric constant, so parasitic capacitance can be reduced. However, the organic resin material is not suitable as a protective film due to its moisture absorbency, so it is preferably combined with the first interlayer insulator 540.

Thereafter, a resist mask with a predetermined pattern is formed, and contact holes reaching a source region or a drain region formed in each semiconductor layer are formed. The contact holes are formed by dry etching. In this case, the second interlayer insulating film 541 made of an organic resin material is first etched using a mixed gas of $CF_4$, $O_2$, and He as an etching gas, and thereafter, the first interlayer insulating film 540 is etched using $CF_4$ and $O_2$ as an etching gas.

Then, a conductive metal film is formed by sputtering or vacuum vapor evaporation. A resist mask pattern is formed, and wires 543 to 549 are formed by etching. Thus, an active matrix substrate can be formed.

The process of manufacturing an active matrix type liquid crystal display device using the active matrix substrate in FIG. 18A will be described. FIG. 18B shows a state in which the active matrix substrate is attached to a counter substrate 554 with a sealant 558. First, column-shaped spacers 551 and 552 are formed on the active matrix substrate shown in FIG. 18A. The spacers 551 provided in the pixel portion are formed so as to be overlapped with a contact portion on the pixel electrode. Although varied depending upon a liquid crystal material to be used, the height of the spacers is set to be 3 to 10 µm. In the contact portion, concave portions are formed corresponding to the contact holes. Therefore, by forming the spacers such that they are aligned with the concave portions, orientation of liquid crystal can be prevented from being disturbed. Thereafter, an alignment film 553 is formed, and a rubbing treatment is conducted. A transparent conductive film 555 and an alignment film 556 are formed on the counter substrate 554. Then, the active matrix substrate and the counter substrate are attached to each other, and liquid crystal 557 is injected therebetween.

An active matrix type liquid crystal display device manufactured as described above can be used as a display apparatus for various electronic devices. The above-mentioned liquid crystal display panel is fully designed for a large area without decreasing an aperture ratio in the pixel portion.

The present embodiment can be arbitrarily combined with any one of Embodiments 1 to 5.

Embodiment 11

The case will be described in which a light-emitting device is manufactured using the active matrix substrate described in Embodiment 10.

Figure 19:
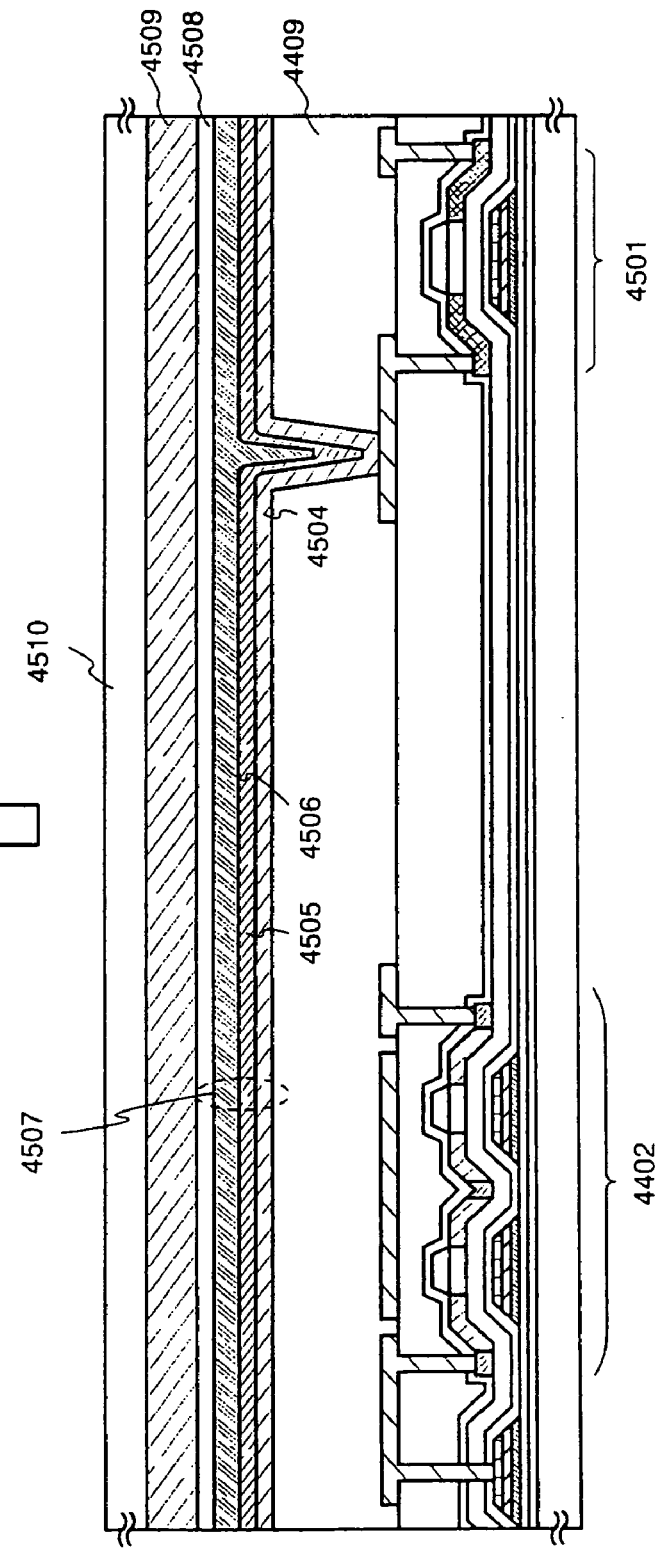
FIG. 19 is a cross-sectional structural view of a pixel portion of a light-emitting device.

In FIG. 19, as a current control TFT 4501, a TFT having the same configuration as that of the n-channel TFT 503 in FIG. 16 is used. Needless to say, a gate electrode of the current control TFT 4501 is electrically connected to a drain line of a switching TFT 4402. A drain line of the current control TFT 4501 is electrically connected to a pixel electrode 4504 formed on an insulating film 4409.

In the present embodiment, the pixel electrode 4504 made of a conductive film functions as a cathode of a light-emitting element. More specifically, an alloy film of aluminum and lithium is used. A conductive film made of an element belonging to Group 1 or 2 in the periodic table or a conductive film with the element added thereto may be used.

A light-emitting layer 4505 is formed on the pixel electrode 4504. In FIG. 19, only one pixel is shown. A light-emitting layer corresponding to G (green) is formed by vapor deposition and coating (preferably, spin coating) in the present embodiment. More specifically, a layered structure is used, in which a LiF film (thickness: 20 nm) is provided as an electron injection layer, and a PPV film (thickness: 70 nm) is provided thereon as a light-emitting layer.

Next, an anode 4506 made of a transparent conductive film is provided on the light-emitting layer 4505. In the present embodiment, a conductive film made of a compound of indium oxide and tin oxide or a compound of indium oxide and zinc oxide is used.

When the anode 4506 is formed, a light-emitting element 4507 is completed. The light-emitting element 4507 refers to a diode composed of the pixel electrode (cathode) 4504, the light-emitting layer 4505, and the anode 4506.

It is effective that a passivation film 4508 is provided so as to completely cover the light-emitting element 4507. As the passivation film 4508, a single-layered structure or a multi-layered structure of an insulating film including a carbon film, a silicon nitride film, or a silicon oxynitride film is used.

Furthermore, a sealing material 4509 is provided on the passivation film 4508, and a cover member 4510 is attached to the sealing material 4509. As the sealing material 4509, UV-curable resin may be used, and it is effective to provide a material having moisture absorbency or a material having an antioxidant effect in the sealing material 4509. Furthermore, in the present embodiment, as the cover member 4510, a glass substrate, a quartz substrate, or a plastic substrate (including a plastic film) with a carbon film (preferably, a DLC film) formed on both sides thereof is used.

The light-emitting device thus manufactured is fully designed for a large area without decreasing an aperture ratio in the pixel portion.

The present embodiment can be arbitrarily combined with any one of embodiments 1 to 5.

Embodiment 12

A wiring board formed according to the present invention can be used for various electrooptic apparatuses (active matrix type liquid crystal display device, active matrix type EC display apparatus, and active matrix type light-emitting device). Specifically, the present invention can be carried out in all the electronic equipment in which these electrooptic apparatuses are incorporated into a display portion.

Figure 20A:
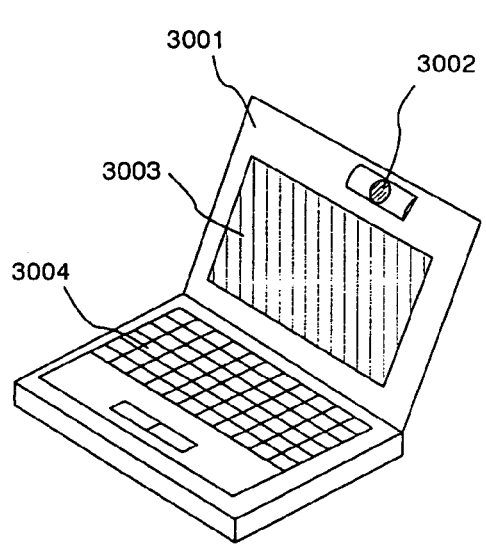
FIGS. 20A to 20C show examples of a semiconductor device.
Figure 20B:
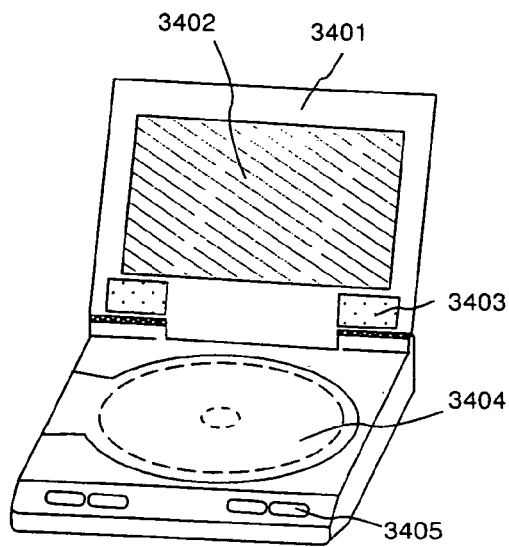
Figure 20C:
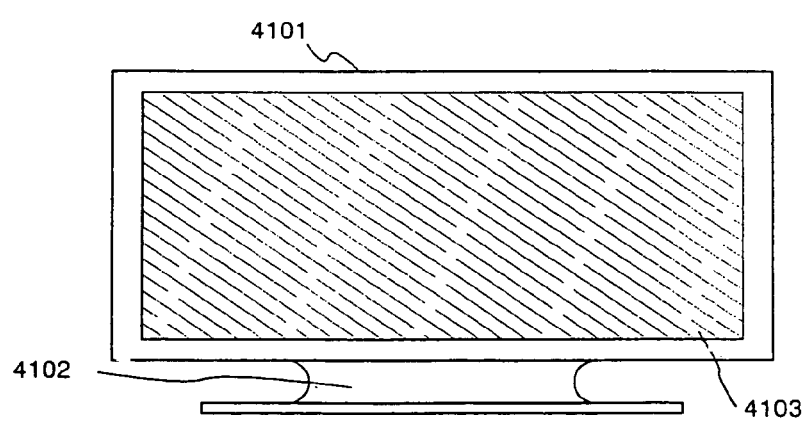

Examples of such electronic equipment include a personal computer and a display. FIGS. 20A to 20C shows examples thereof.

FIG. 20A shows a personal computer, which includes a body 3001, an image input part 3002, a display part 3003, a keyboard 3004, and the like. The present invention is applicable to the display part 3003. The present invention is ready for enlargement of the display part 3003.

FIG. 20B shows a player using a recording medium storing a program (hereinafter, merely referred to as a recording medium), which includes a body 3401, a display part 3402, a speaker part 3403, a recording medium 3404, an operation switch 3405, and the like. This player uses a digital versatile disk (DVD), a compact disk (CD), and the like as a recording medium, and can be used for listening to music, seeing movies, playing games, and performing the Internet. The present invention is applicable to the display part 3402. The present invention is ready for enlargement of the display part 3402.

FIG. 20C shows a display, which includes a body 4101, a support 4102, a display part 4103, and the like. The present invention is applicable to the display part 4103. The display of the present invention is fully ready for enlargement of a screen. In particular, the present invention is advantageous for a display of 10 inches or more in the opposite angle (particularly, 30 inches or more).

As described above, the range of application of the present invention is extremely large and the present invention is applicable to various fields of electronic equipment. Further, electronic equipment of the present embodiment can be realized by adopting the constitution using any combination of embodiments 1 to 11.

By adopting the constitution of the present invention, the following basic significance can be obtained.

(a) A simple method suitable for processes of manufacturing conventional wiring or wiring board.

(b) Low-resistance can be realized in wiring. Therefore, a degree of design freedom and an aperture ratio in a pixel portion are enhanced.

(c) Satisfactory coverage is obtained.

(d) In a semiconductor device such as an active matrix type liquid crystal display device, while the above-mentioned advantages are satisfied, the area of a pixel portion is enlarged, and the present invention is fully ready for enlargement of a screen, which enhances operational characteristics and reliability of the semiconductor device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A display device comprising:
a first gate wiring on an insulating surface;
a second gate wiring on the insulating surface, wherein each of the first gate wiring and said second gate wiring comprises:
a first conductive layer on the insulating surface;
a second conductive layer comprising copper or aluminum on the first conductive layer; and
a third conductive layer on the second conductive layer,
a gate insulating film over the second gate wiring;
a channel forming region and a pair of impurity regions, over the gate insulating film;
a connection electrode over the pair of impurity regions, and directly connected to the first gate wiring and one of the pair of impurity regions; and
a pixel electrode over the pair of impurity regions, and electrically connected to another one of the pair of impurity regions,
wherein a cross-section of each of the first conductive layer, the second conductive layer, and the third conductive layer has a taper shape, and
wherein an angle of the taper shape of the second conductive layer is larger than that of the first conductive layer.

2. The display device according to claim 1, wherein the first conductive layer comprises at least one material selected from the group consisting of W and Mo.

3. The display device according to claim 1, wherein the third conductive layer comprises Ti.

4. The display device according to claim 1, wherein the angle of the taper shape of at least one of the first conductive layer, the second conductive layer, and the third conductive layer is 5° to 30°.

5. The display device according to claim 1, wherein the first gate wiring and the second gate wiring are formed by dry etching.

6. The display device according to claim 1, wherein the second conductive layer is covered with the first conductive layer, the third conductive layer, and an insulating film, and a region of the second conductive layer contacting the insulating film is oxidized.

7. The display device according to claim 1, wherein the display device is used for at least one selected from the group consisting of a liquid crystal display device and a light-emitting device.

8. A display device comprising:
a pixel portion, said pixel portion comprising:
a first gate wiring on an insulating surface;
a pixel thin film transistor; and
a capacitor,
wherein said pixel thin film transistor comprises:
a second gate wiring on the insulating surface, wherein said second gate wiring comprises:
a first conductive layer on the insulating surface;
a second conductive layer comprising copper or aluminum on the first conductive layer; and
a third conductive layer on the second conductive layer,
a gate insulating film over the second gate wiring;
a channel forming region and a pair of impurity regions, over the gate insulating film;
a connection electrode over the pair of impurity regions, and directly connected to the first gate wiring and one of the pair of impurity regions; and
a pixel electrode over the pair of impurity regions, and electrically connected to another one of the pair of impurity regions,
wherein a cross-section of each of the first conductive layer, the second conductive layer, and the third conductive layer has a taper shape,
wherein an angle of the taper shape of the second conductive layer is larger than that of the first conductive layer, and
wherein the first gate wiring comprising the first conductive layer, the second conductive layer and the third conductive layer.

9. The display device according to claim 8, wherein the first conductive layer comprises at least one material selected from the group consisting of W and Mo.

10. The display device according to claim 8, wherein the third conductive layer comprises Ti.

11. The display device according to claim 8, wherein the angle of the taper shape of at least one of the first conductive layer, the second conductive layer, and the third conductive layer is 5° to 30°.

12. The display device according to claim 8, wherein the first gate wiring and the second gate wiring are formed by dry etching.

13. The display device according to claim 8, wherein the second conductive layer is covered with the first conductive layer, the third conductive layer, and an insulating film, and a region of the second conductive layer contacting the insulating film is oxidized.

14. The display device according to claim 8, wherein the display device is used for at least one selected from the group consisting of a liquid crystal display device and a light-emitting device.

15. A display device comprising:
a driving circuit formed over a substrate, said driving circuit comprising:
a n-channel type thin film transistor; and
a p-channel type thin film transistor,
a pixel portion formed over the substrate, said pixel portion comprising:
a first gate wiring on an insulating surface;
a pixel thin film transistor; and
a capacitor,
wherein each of said n-channel type thin film transistor, said p-channel type thin film transistor, and said pixel thin film transistor comprises:
a second gate wiring on the insulating surface over the substrate, wherein said second gate wiring comprises:
a first conductive layer on the insulating surface;
a second conductive layer comprising copper on the first conductive layer; and
a third conductive layer on the second conductive layer,
a gate insulating film over the second gate wiring; and
a channel forming region and a pair of impurity regions, over the gate insulating film,
a connection electrode over the pair of impurity regions, and directly connected to the first gate wiring and one of the pair of impurity regions; and
a pixel electrode over the pair of impurity regions, and electrically connected to another one of the pair of impurity regions,
wherein a cross-section of each of the first conductive layer, the second conductive layer, and the third conductive layer has a taper shape, and
wherein an angle of the taper shape of the second conductive layer is larger than that of the first conductive layer, and
wherein the first gate wiring comprising the first conductive layer, the second conductive layer and the third conductive layer.

16. The display device according to claim 15, wherein the first conductive layer comprises at least one material selected from the group consisting of W and Mo.

17. The display device according to claim 15, wherein the third conductive layer comprises Ti.

18. The display device according to claim 15, wherein the angle of the taper shape of at least one of the first conductive layer, the second conductive layer, and the third conductive layer is 5° to 30°.

19. The display device according to claim 15, wherein the first gate wiring and the second gate wiring are formed by dry etching.

20. The display device according to claim 15, wherein the second conductive layer is covered with the first conductive layer, the third conductive layer, and an insulating film, and a region of the second conductive layer contacting the insulating film is oxidized.

21. The display device according to claim 15, wherein the display device is used for at least one selected from the group consisting of a liquid crystal display device and a light-emitting device.

22. A display device comprising:
a pixel portion, said pixel portion comprising:
a first gate wiring on an insulating surface;
a current controlling thin film transistor; and
a switching thin film transistor,
wherein each of said current controlling thin film transistor and said switching thin film transistor comprises:
a second gate wiring on the insulating surface, wherein said second gate wiring comprises:
a first conductive layer on the insulating surface;
a second conductive layer comprising copper or aluminum on the first conductive layer; and
a third conductive layer on the second conductive layer,
a gate insulating film over the second gate wiring; and
a channel forming region and a pair of impurity regions, over the gate insulating film,
a connection electrode over the pair of impurity regions, and directly connected to the first gate wiring and one of the pair of impurity regions; and
a pixel electrode over the pair of impurity regions, and electrically connected to another one of the pair of impurity regions,
wherein a cross-section of each of the first conductive layer, the second conductive layer, and the third conductive layer has a taper shape, and
wherein an angle of the taper shape of the second conductive layer is larger than that of the first conductive layer, and
wherein the first gate wiring comprising the first conductive layer, the second conductive layer and the third conductive layer.

23. The display device according to claim 22, wherein the first conductive layer comprises at least one material selected from the group consisting of W and Mo.

24. The display device according to claim 22, wherein the third conductive layer comprises Ti.

25. The display device according to claim 22, wherein the angle of the taper shape of at least one of the first conductive layer, the second conductive layer, and the third conductive layer is 5° to 30°.

26. The display device according to claim 22, wherein the first gate wiring and the second gate wiring are formed by dry etching.

27. The display device according to claim 22, wherein the second conductive layer is covered with the first conductive layer, the third conductive layer, and an insulating film, and a region of the second conductive layer contacting the insulating film is oxidized.

28. The display device according to claim 22, wherein the display device is used for at least one selected from the group consisting of a liquid crystal display device and a light-emitting device.

29. A display device comprising:
a driving circuit formed over a substrate, said driving circuit comprising:
a n-channel type thin film transistor; and
a p-channel type thin film transistor,
a pixel portion formed over the substrate, said pixel portion comprising:
a first gate wiring on an insulating surface;
a current controlling thin film transistor; and
a switching thin film transistor, wherein each of said n-channel type thin film transistor, said p-channel type thin film transistor, said current controlling thin film transistor, and said switching thin film transistor comprises:
- a second gate wiring on the insulating surface formed over the substrate, wherein said second gate wiring comprises:
  - a first conductive layer on the insulating surface;
  - a second conductive layer comprising copper or aluminum on the first conductive layer; and
  - a third conductive layer on the second conductive layer,
- a gate insulating film over the second gate wiring; and
- a channel forming region and a pair of impurity regions, over the gate insulating film,
- a connection electrode over the pair of impurity regions, and directly connected to the first gate wiring and one of the pair of impurity regions; and
- a pixel electrode over the pair of impurity regions, and electrically connected to another one of the pair of impurity regions,
- wherein a cross-section of each of the first conductive layer, the second conductive layer, and the third conductive layer has a taper shape, and
- wherein an angle of the taper shape of the second conductive layer is larger than that of the first conductive layer, and
- wherein the first gate wiring comprising the first conductive layer, the second conductive layer and the third conductive layer.

30. The display device according to claim 29, wherein the first conductive layer comprises at least one material selected from the group consisting of W and Mo.

31. The display device according to claim 29, wherein the third conductive layer comprises Ti.

32. The display device according to claim 29, wherein the angle of the taper shape of at least one of the first conductive layer, the second conductive layer, and the third conductive layer is 5° to 30°.

33. The display device according to claim 29, wherein the first gate wiring and the second gate wiring are formed by dry etching.

34. The display device according to claim 29, wherein the second conductive layer is covered with the first conductive layer, the third conductive layer, and an insulating film, and a region of the second conductive layer contacting the insulating film is oxidized.

35. The display device according to claim 29, wherein the display device is used for at least one selected from the group consisting of a liquid crystal display device and a light-emitting device.

36. The display device according to claim 1, further comprising a third wiring overlapping the channel forming region, and electrically connected to the second gate wiring.

37. The display device according to claim 8, further comprising a third wiring overlapping the channel forming region, and electrically connected to the second gate wiring.

38. The display device according to claim 15, further comprising a third wiring overlapping the channel forming region, and electrically connected to the second gate wiring.

39. The display device according to claim 22, further comprising a third wiring overlapping the channel forming region, and electrically connected to the second gate wiring.

40. The display device according to claim 29, further comprising a third wiring overlapping the channel forming region, and electrically connected to the second gate wiring.

41. The display device according to claim 36, further comprising an insulating film over the pair of impurity regions, wherein the pixel electrode, the second wiring and the third wiring are provided over the insulating film.

42. The display device according to claim 37, further comprising an insulating film over the pair of impurity regions, wherein the pixel electrode, the second wiring and the third wiring are provided over the insulating film.

43. The display device according to claim 38, further comprising an insulating film over the pair of impurity regions, wherein the pixel electrode, the second wiring and the third wiring are provided over the insulating film.

44. The display device according to claim 39, further comprising an insulating film over the pair of impurity regions, wherein the pixel electrode, the second wiring and the third wiring are provided over the insulating film.

45. The display device according to claim 40, further comprising an insulating film over the pair of impurity regions, wherein the pixel electrode, the second wiring and the third wiring are provided over the insulating film.

46. The display device according to claim 1, wherein the channel forming regions and the pair of impurity regions are provided in a semiconductor layer.

47. The display device according to claim 8, wherein the channel forming regions and the pair of impurity regions are provided in a semiconductor layer.

48. The display device according to claim 15, wherein the channel forming regions and the pair of impurity regions are provided in a semiconductor layer.

49. The display device according to claim 22, wherein the channel forming regions and the pair of impurity regions are provided in a semiconductor layer.

50. The display device according to claim 29, wherein the channel forming regions and the pair of impurity regions are provided in a semiconductor layer.

51. The display device according to claim 46, wherein the semiconductor layer is crystalline.

52. The display device according to claim 47, wherein the semiconductor layer is crystalline.

53. The display device according to claim 48, wherein the semiconductor layer is crystalline.

54. The display device according to claim 49, wherein the semiconductor layer is crystalline.

55. The display device according to claim 50, wherein the semiconductor layer is crystalline.

* * * * *